United States Patent
Yang et al.

(10) Patent No.: US 11,114,374 B2
(45) Date of Patent: Sep. 7, 2021

(54) GRAPHENE ENABLED SELECTIVE BARRIER LAYER FORMATION

(71) Applicant: Taiwan Semiconductor Manufacturing Co., Ltd., Hsinchu (TW)

(72) Inventors: Shin-Yi Yang, New Taipei (TW); Guanyu Luo, Hsinchu (TW); Chin-Lung Chung, Hsinchu (TW); Ming-Han Lee, Taipei (TW); Shau-Lin Shue, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/547,847

(22) Filed: Aug. 22, 2019

(65) Prior Publication Data

US 2021/0057335 A1 Feb. 25, 2021

(51) Int. Cl.
*H01L 23/52* (2006.01)
*H01L 23/522* (2006.01)
*H01L 23/528* (2006.01)
*H01L 23/532* (2006.01)
*H01L 21/768* (2006.01)

(52) U.S. Cl.
CPC .... *H01L 23/5226* (2013.01); *H01L 21/76802* (2013.01); *H01L 21/76843* (2013.01); *H01L 23/528* (2013.01); *H01L 23/53223* (2013.01); *H01L 23/53238* (2013.01); *H01L 23/53252* (2013.01); *H01L 23/53266* (2013.01)

(58) Field of Classification Search
CPC ......... H01L 21/76843; H01L 21/76802; H01L 23/528; H01L 23/53223; H01L 23/53238; H01L 23/53252; H01L 23/5226; H01L 23/53266
USPC .......................................... 257/751
See application file for complete search history.

(56) References Cited

U.S. PATENT DOCUMENTS

| | | | |
|---|---|---|---|
| 8,349,724 B2* | 1/2013 | Fu ..................... | H01L 21/76877 438/627 |
| 8,399,772 B2* | 3/2013 | Gosset ............... | H01L 29/0673 174/250 |
| 9,520,362 B2 | 12/2016 | Lin et al. | |
| 9,613,854 B2* | 4/2017 | Yang ................. | H01L 21/76831 |
| 9,716,032 B2 | 7/2017 | Tang et al. | |
| 10,461,027 B2* | 10/2019 | Lee ..................... | H01L 21/0228 |
| 2016/0307793 A1* | 10/2016 | Huang ............... | H01L 23/5222 |

OTHER PUBLICATIONS

Xilai Jia et al., "Advances in Production and Applications of Carbon Nanotubes," Top Curr Chem (Z) (2017) 375:18, DOI 10.1007/s41061-017-0102-2, Received Aug. 31, 2016, Accepted Jan. 2, 2017, Published online Jan. 30, 2017, 35 pages.

* cited by examiner

*Primary Examiner* — Luan C Thai
(74) *Attorney, Agent, or Firm* — Haynes and Boone, LLP

(57) ABSTRACT

Interconnect structures and method of forming the same are disclosed herein. An exemplary interconnect structure includes a first contact feature in a first dielectric layer, a second dielectric layer over the first dielectric layer, a second contact feature over the first contact feature, a barrier layer between the second dielectric layer and the second contact feature, and a graphene layer between the second contact feature and the first contact feature.

20 Claims, 17 Drawing Sheets

GRAPHENE ENABLED SELECTIVE BARRIER LAYER FORMATION

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as interconnect structures and contact structure become more compact with ever-shrinking IC feature size, these interconnect and contact structures are exhibiting increased contact resistance, which presents performance, yield, and cost challenges. It has been observed that higher contact resistances exhibited by interconnect and contact structures in advanced IC technology nodes can significantly delay (and, in some situations, prevent) signals from being routed efficiently to and from IC devices, such as transistors, negating any improvements in performance of such IC devices in the advanced technology nodes. Accordingly, although existing interconnect and contact structures have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
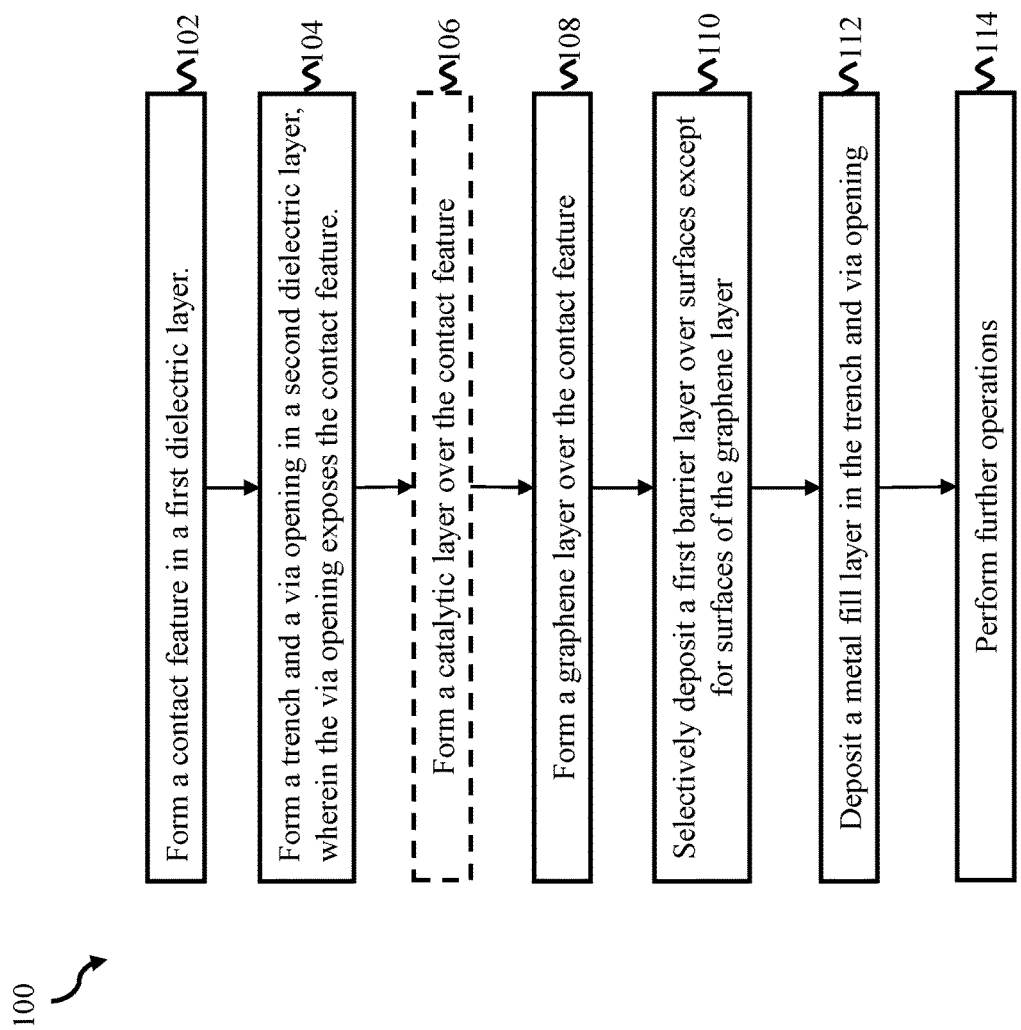
FIG. 1 is a flow chart of a method for fabricating a back-end-of-line (BEOL) interconnect structure of a multilayer interconnect feature according to various aspects of the present disclosure.

The present disclosure relates generally to integrated circuit (IC) devices, and more particularly, to interconnect and contact structures of IC devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes can include forming isolation features, gate structures, and source and drain features (generally referred to as source/drain features). MEOL generally encompasses processes related to fabricating contacts to conductive features (or conductive regions) of the IC devices, such as contacts to the gate structures and/or the source/drain features. BEOL generally encompasses processes related to fabricating a multilayer interconnect (MLI) feature that interconnects IC features fabricated by FEOL and MEOL (referred to herein as FEOL and MEOL features or structures, respectively), thereby enabling operation of the IC devices.

As IC technologies progress towards smaller technology nodes, MEOL and BEOL processes are experiencing significant challenges. For example, advanced IC technology nodes require more compact BEOL interconnect structure and MEOL contact structure, which require significantly reducing critical dimensions of conductive features (for example, widths and/or heights of vias and/or conductive lines of the interconnects and contacts). The reduced critical dimensions have led to significant increases in interconnect resistance, which can degrade IC device performance (for example, by increasing resistance-capacitance (RC) delay). This RC delay is further exacerbated by the increase of resistivity due to use of metal nitrides as the barrier layer.

The present disclosure discloses use of a graphene layer as a blocking layer for selective barrier layer formation such that the barrier layer is only formed on sidewalls, rather than along the conduction path. Graphene is an allotrope of carbon in the form of a single layer of atoms in a two-dimensional hexagonal lattice in which one atom forms each vertex. The graphene layer of the present disclosure not only serves as a blocking layer for the barrier layer but also exhibit low contact resistance. In some implementations, a thin catalytic metal layer may be formed over a top surface of a lower contact feature and the graphene layer may be formed on the catalytic metal layer. In addition, the graphene layer also has superior barrier property, leading to excellent reliability. The present disclosure also discloses a method of implementing the graphene layer in the formation of a BEOL interconnect structure or an MEOL contact structure in an IC device.

FIG. 1 illustrates a flow chart of a method 100 for fabricating a BEOL interconnect structure of a semiconductor device according to various aspects of the present disclosure. FIG. 1 will be described below in conjunction with FIGS. 2, 3A, 3B, 4A, 4B, 5A, and 5B, which are fragmentary cross-sectional views of a BEOL interconnect structure of a semiconductor device at various stages of fabrication according to method 100 in FIG. 1. Additional steps can be provided before, during, and after method 100, and some of the steps described can be moved, replaced, or eliminated for additional embodiments of method 100. Additional features can be added in the BEOL interconnect structure depicted in FIGS. 2, 3A, 3B, 4A, 4B, 5A, and 5B, and some of the features described below can be replaced, modified, or eliminated in other embodiments of the BEOL interconnect structure.

Figure 2:
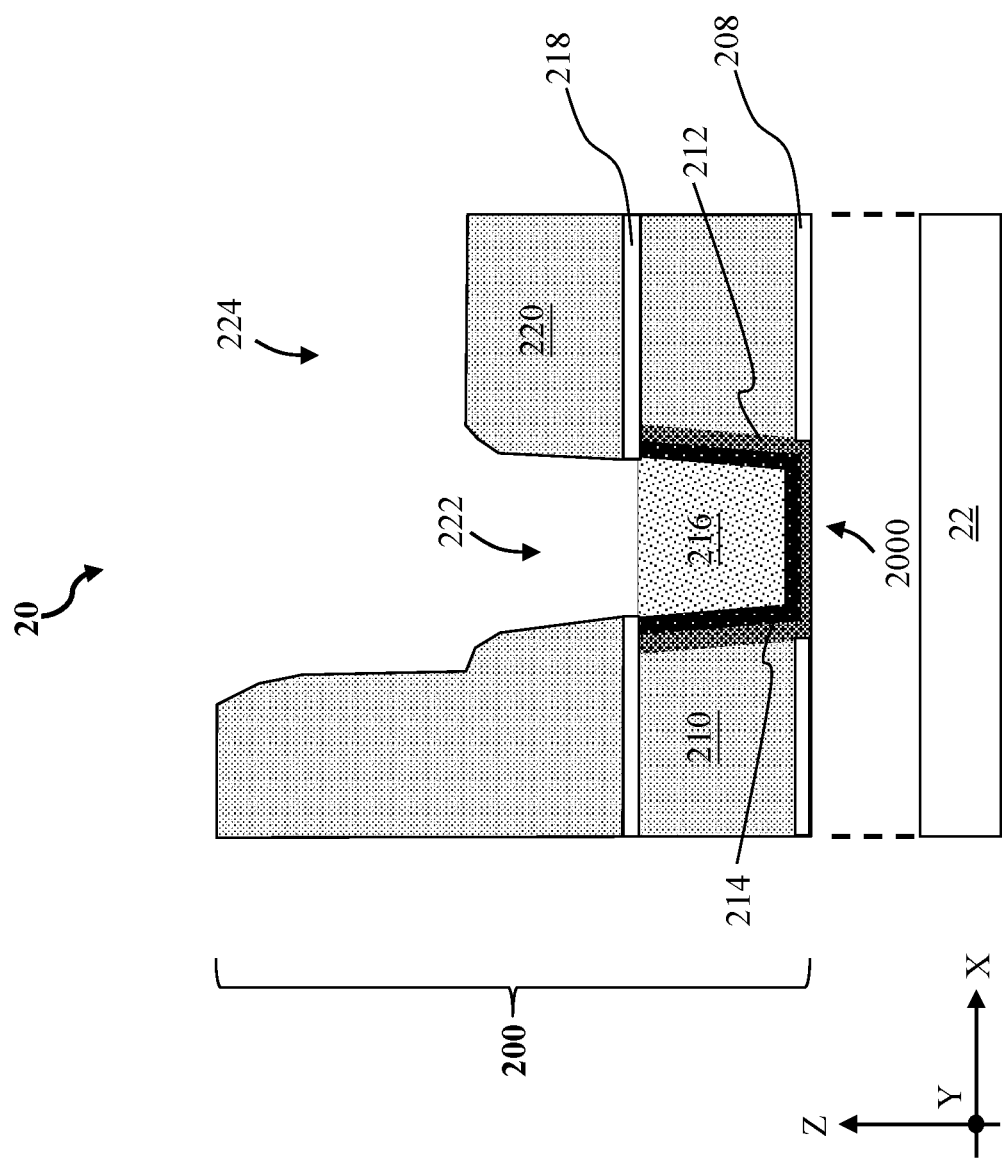
FIGS. 2, 3A, 3B, 4A, 4B, 5A, and 5B are fragmentary cross-sectional views of a BEOL interconnect structure of a semiconductor device at various stages of fabrication, according to various aspects of the present disclosure.

Referring to FIGS. 1 and 2, the method 100 includes a block 102 where a contact feature, such the contact feature 2000, is formed in a first dielectric layer 210 of an interconnect structure 200 in a semiconductor device 20. The first dielectric layer 210 may be a first interlayer dielectric (ILD) layer. The semiconductor device 20 can be included in a microprocessor, a memory, and/or other IC device. In some implementations, the semiconductor device 20 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or multi-gate transistors, such as fin-like FETs (FinFETs). FIG. 2 has been simplified for the sake of clarity to better understand the inventive concepts of the present disclosure. Additional features can be added in the semiconductor device 20, and some of the features described below can be replaced, modified, or eliminated in other embodiments of the semiconductor device 20.

The semiconductor device 20 includes a substrate (wafer) 22. In the depicted embodiment, substrate 22 includes silicon. Alternatively or additionally, substrate 22 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, substrate 22 includes one or more group III-V materials, one or more group II-IV materials, or combinations thereof. In some implementations, substrate 22 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

Substrate 22 can include various doped regions (not shown) configured according to design requirements of semiconductor device 20, such as p-type doped regions, n-type doped regions, or combinations thereof. P-type doped regions (for example, p-type wells) include p-type dopants, such as boron, indium, other p-type dopant, or combinations thereof. N-type doped regions (for example, n-type wells) include n-type dopants, such as phosphorus, arsenic, other n-type dopant, or combinations thereof. In some implementations, substrate 22 includes doped regions formed with a combination of p-type dopants and n-type dopants. The various doped regions can be formed directly on and/or in substrate 22, for example, providing a p-well structure, an n-well structure, a dual-well structure, a raised structure, or combinations thereof. An ion implantation process, a diffusion process, and/or other suitable doping process can be performed to form the various doped regions. For simplicity, the substrate 22 is not illustrated in FIGS. 3A, 3B, 4A, 4B, 5A, and 5B.

An isolation feature(s) (not shown) is formed over and/or in substrate 22 to isolate various regions, such as various device regions, of semiconductor device 20. For example, isolation features define and electrically isolate active device regions and/or passive device regions from each other. Isolation features include silicon oxide, silicon nitride, silicon oxynitride, other suitable isolation material, or combinations thereof. Isolation features can include different structures, such as shallow trench isolation (STI) structures, deep trench isolation (DTI) structures, and/or local oxidation of silicon (LOCOS) structures. In some implementations, isolation features include STI features. For example, STI features can be formed by etching a trench in substrate 22 (for example, by using a dry etch process and/or wet etch process) and filling the trench with insulator material (for example, by using a chemical vapor deposition (CVD) process or a spin-on glass process). A chemical mechanical polishing (CMP) process may be performed to remove excessive insulator material and/or planarize a top surface of isolation features. In some embodiments, STI features include a multi-layer structure that fills the trenches, such as a silicon nitride layer disposed over an oxide liner layer.

While not shown, various gate structures are disposed over the substrate 22 and one or more of them interpose a source region and a drain region, where a channel region is defined between the source region and the drain region. The one or more gate structures engage the channel region, such that current can flow between the source/drain regions during operation. In some implementations, gate structures are formed over a fin structure, such that gate structures each wrap a portion of the fin structure. For example, one or more of gate structures wrap channel regions of the fin structure, thereby interposing source regions and drain regions of the fin structure. In some embodiments, gate structures include metal gate (MG) stacks that are configured to achieve desired functionality according to design requirements of the semiconductor device 20. In some implementations, metal gate stacks include a gate dielectric and a gate electrode over the gate dielectric. The gate dielectric includes a dielectric material, such as silicon oxide, high-k dielectric material, other suitable dielectric material, or combinations thereof. High-k dielectric material generally refers to dielectric materials having a high dielectric constant, for example, greater than a dielectric constant of silicon oxide ($k \approx 3.9$). Exemplary high-k dielectric materials include hafnium, aluminum, zirconium, lanthanum, tantalum, titanium, yttrium, oxygen, nitrogen, other suitable constituent, or combinations thereof. In some implementations, the gate dielectric includes a multilayer structure, such as an interfacial layer including, for example, silicon oxide, and a high-k dielectric layer including, for example, $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. The gate electrode includes an electrically conductive material. In some implementations, the gate electrode includes multiple layers, such as one or more capping layers, work function layers, glue/barrier layers, and/or metal fill (or bulk) layers. A capping layer can include a material that prevents or eliminates diffusion and/or reaction of constituents between the gate dielectric and other layers of the gate electrode. In some implementations, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu.

Epitaxial source features and epitaxial drain features (referred to as epitaxial source/drain features) may be disposed in source/drain regions of substrate 22. Gate structure and epitaxial source/drain features form a portion of a transistor of the semiconductor device 20. Gate structure and/or epitaxial source/drain features are thus alternatively referred to as device features. In some implementations, epitaxial source/drain features wrap source/drain regions of a fin structure. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. Epitaxial source/drain features may be doped with n-type dopants and/or p-type dopants. In some implementations, where the transistor is configured as an n-type device (for example, having an n-channel), epitaxial source/drain features can be silicon-containing epitaxial layers or silicon-carbon-containing epitaxial layers doped with phosphorous, other n-type dopant, or combinations thereof (for example, forming Si:P epitaxial layers or Si:C:P epitaxial layers). In some implementations, where the transistor is configured as a p-type device (for example, having a p-channel), epitaxial source/drain features can be silicon-and-germanium-containing epitaxial layers doped with boron, other p-type dopant, or combinations thereof (for example, forming Si:Ge:B epitaxial layers). In some implementations, annealing processes are performed to activate dopants in epitaxial source/drain features of the semiconductor device 20.

In some implementations, silicide layers are formed on epitaxial source/drain features. In some implementations, silicide layers are formed by depositing a metal layer over epitaxial source/drain features. The metal layer includes any material suitable for promoting silicide formation, such as nickel, platinum, palladium, vanadium, titanium, cobalt, tantalum, ytterbium, zirconium, other suitable metal, or combinations thereof. The semiconductor device 20 is then heated (for example, subjected to an annealing process) to cause constituents of epitaxial source/drain features (for example, silicon and/or germanium) to react with the metal. The silicide layers thus include metal and a constituent of epitaxial source/drain features (for example, silicon and/or germanium). In some implementations, the silicide layers include nickel silicide, titanium silicide, or cobalt silicide. Any un-reacted metal, such as remaining portions of the metal layer, may be selectively removed by any suitable process, such as an etching process.

The interconnect structure 200 is disposed over substrate 22. The interconnect structure 200 may electrically couple various devices (for example, transistors, resistors, capacitors, and/or inductors) and/or components (for example, gate structures and/or source/drain features) of the semiconductor device 20, such that the various devices and/or components can operate as specified by design requirements of the semiconductor device 20. The interconnect structure 200 includes a combination of dielectric layers and electrically conductive layers (for example, metal layers) configured to form various interconnect structures. The conductive layers are configured to form vertical interconnect features (providing, for example, vertical connection between features and/or vertical electrical routing), such as contacts and/or vias, and/or horizontal interconnect features (providing, for example, horizontal electrical routing), such as conductive lines (or metal lines). Vertical interconnect features typically connect horizontal interconnect features in different layers the interconnect structure 200. During operation, the interconnect features are configured to route signals between the devices and/or the components of the semiconductor device 20 and/or distribute signals (for example, clock signals, voltage signals, and/or ground signals) to the devices and/or the components of the semiconductor device 20. Though the interconnect structure 200 is depicted with a given number of dielectric layers and conductive layers, the present disclosure contemplates the interconnect structure 200 having more or less dielectric layers and/or conductive layers.

Referring still to FIG. 2, the interconnect structure 200 includes one or more dielectric layers (i.e. ILD layers), such as the first dielectric layer 210 and other dielectric layers over the first dielectric layer 210. These dielectric layers include a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In some instances, the ILD layers are formed of low-k dielectric materials with a dielectric constant between about 1 and about 3.8. In some embodiments, the interconnect structure 200 may also include one or more contact etch stop layers (CESL) disposed over substrate 22, such as a first CESL 208 under the first dielectric layer 210 and a second CESL 218 over the first dielectric layer 210. Such CESLs include a material different than the ILD layers. For example, the material of the first dielectric layer 210 is different than the material of the first CESL 208. In some embodiments, the first CESL 208 includes silicon and nitrogen, such as silicon nitride or silicon oxynitride. The ILD layers and/or CESLs are formed over substrate 22, for example, by a deposition process (such as CVD, PVD, ALD, HDPCVD, MOCVD, RPCVD, PECVD, LPCVD, ALCVD, APCVD, other suitable methods, or combinations thereof). In some implementations, ILD layers and/or CESLs are formed by a flowable CVD (FCVD) process that includes, for example, depositing a flowable material (such as a liquid compound) over substrate 22 and converting the flowable material to a solid material by a suitable technique, such as thermal annealing and/or ultraviolet radiation treating. Subsequent to the deposition of ILD layers and/or CESLs, a CMP process and/or other planarization process is performed, such that ILD layers and/or CESLs have substantially planar surfaces for enhancing formation of overlying layers.

At block 102 of the method 100, a contact feature 2000 is formed in the first dielectric layer 210. The contact feature 2000 represents a BEOL contact feature that interfaces an MEOL device-level contact, such as a gate contact electrically coupled to a gate structure and a source/drain contact electrically coupled to the epitaxial source/drain feature. In some embodiments illustrated in FIG. 2, the contact feature 2000 may include a barrier layer 212, a liner 214 and a metal fill layer 216. In some implementations, the barrier layer 212 may be formed of Ta, TaN, TaC, Ti, TiN, TiC, and other suitable material that can block oxygen diffusion. The liner 214 may be formed of suitable metal, metal nitride, or metal carbide, such as Co, CoN and RuN. The metal fill layer 216 may be formed of any suitable conductive material, such as tungsten (W), nickel (Ni), iridium (Jr), osmium (Os), gold (Au), palladium (Pd), platinum (Pt), silver (Ag), tantalum (Ta), titanium (Ti), aluminum (Al), copper (Cu), cobalt (Co), tantalum nitride (TaN), titanium nitride (TiN), ruthenium (Ru), or alloys thereof. In some embodiments, formation of the contact feature 2000 may include patterning the first dielectric layer 210 and the first CESL 208. Patterning the first dielectric layer 210 and first CESL 208 can include lithography processes and/or etching processes to form via openings. In some implementations, the lithography processes include forming a resist layer over the first dielectric layer 210 and/or first CESL 208, exposing the resist layer to pattern radiation, and developing the exposed resist layer, thereby forming a patterned resist layer that can be used as a masking element for etching openings in the first dielectric layer 210 and/or first CESL 208. The etching processes include dry etching processes, wet etching processes, other etching processes, or combinations thereof. Thereafter, the opening(s) are filled with the barrier layer 212, the liner 214, and the metal fill layer 216. In some embodiments, the barrier layer 212 may be deposited using atomic layer deposition (ALD), chemical vapor deposition (CVD), or electroless deposition (ELD) and may be formed to a thickness between about 0.5 nm and about 5 nm. In some implementations, the liner 214 may be deposited using ALD, CVD, ELD, or physical vapor deposition (PVD) and may be formed to a thickness between about 0.5 nm and 3 nm. In some instances, the metal fill layer 216 may be deposited using PVD, CVD, ALD, electroplating, ELD, or other suitable deposition process, or combinations thereof. Thereafter, any excess material(s) can be removed by a planarization process, such as a CMP process, thereby planarizing top surfaces of the first dielectric layer 210, the barrier layer 212, the liner 214, and the metal fill layer 216. While the contact feature 2000 illustrated in FIG. 2 includes the barrier layer 212 and the liner 214, the present disclosure is not so limited. One or both the barrier layer 212 and the liner 214 may be omitted. For example, in some instances, the barrier layer 212 may be omitted if the metal fill layer 216 is formed of tungsten or ruthenium. For another example, when the adhesion between the barrier layer 212 and the metal fill layer 216 is satisfactory, the liner 214 may be omitted. In other instances, both the barrier layer 212 and the liner 214 are omitted.

After the top surfaces of the first dielectric layer 210, the barrier layer 212, the liner 214, and the metal fill layer 216 are planarized, the second CESL 218 may be deposited over the first dielectric layer 210 and a second dielectric layer 220 may be deposited over the second CESL 218. The formation process and materials of the second CESL 218 is similar to those used for forming the first CESL 208 described above and will not be repeated here. Similarly, the second dielectric layer 220 may be formed using materials and processes similar to those used for forming the first dielectric layer 210 and is not described further here.

Referring still to FIGS. 1 and 2, the method 100 includes a block 104 where a trench 224 and a via opening 222 may be formed in the second dielectric layer 220 and through the second CESL 218. In some embodiments, the trench 224 is larger than the via opening 222 in dimensions along the X direction and/or the Y direction. The trench 224 may be utilized to form a conductive line (or metal line) that extends along the X direction or the Y direction. In some representative implementations shown in FIG. 2, the contact feature 2000 is exposed through the via opening 222 in the bottom surface of the trench 224. The formation of the trench 224 and the via opening 222 may be performed by a suitable wet etch or dry etch process. For example, a suitable dry etch process may be an ion beam etching (IBE) process with an IBE power level between about 100V and about 2000V, a beam angle between about 0° and about 70°, and an inert gas selected from helium, neon, argon, krypton, or xenon. Another suitable dry etch process may be an inductively coupled plasma-reactive ion etching (ICP-RIE or RIE-ICP) process, with a transformer coupled plasma power between about 100 W and about 1500 W, a bias level between about 0 V and about 300 V, and one or more organic gas species, such as acetic acid ($CH_3COOH$), methanol ($CH_3OH$), or ethanol ($C_2H_5OH$). Yet another suitable dry etch process may be an RIE-ICP process, with a with a transformer coupled plasma (TCP) power between about 100 W and about 1500 W, a bias voltage between about 0 V and about 500 V, a fluorocarbon gas, such as tetrafluoromethane ($CF_4$), trifluoromethane ($CHF_3$), difluoromethane ($CH_2F_2$), perfluorocyclobutane ($C_4F_8$), hexafluoro butadiene ($C_4F_6$), along with nitrogen, oxygen, or argon. Still another suitable dry etch process may be an RIE process, with TCP power level between about 100 W and about 2000 W, a bias voltage between about 0 V and about 500 V, a halogen or halocarbon compound such as chlorine ($Cl_2$), chlorosilane ($SiCl_4$), chloroborane ($BCl_3$), fluorocarbon (such as $CF_4$, $CHF_3$, $CH_2F_2$, $C_4F_8$, $C_4F_6$), along with nitrogen, oxygen, or argon. A suitable wet etch process may include use of one or more wet clean (wet etchant) components and one or more inhibitor components. Examples of the wet clean components include Tolunitrile, 4-Methyl-3-nitrobenzonitrile, 4-(Bromomethyl)benzonitrile, 4-(Chloromethyl)benzonitrile, 2-Fluoro-4-(trifluoromethyl)benzonitrile, 4-(Trifluoromethyl)benzonitrile, Diethylene glycol monobutyl ether, 2-(2-Butoxyethoxy)ethyl acetate, Diethylene glycol dimethyl ether, Dimethyl sulfoxide, Dimethylformamide, Poly(ethylene glycol) bis(amine), (2-Methylbutyl)amine, Tris(2-ethylhexyl)amine, (4-Isothiocyanatophenyl)(3-methylphenyl)amine, Poly(ethylene glycol) methyl ether amine, Poly(ethylene glycol) diamine, Triethanolamine hydrochloride, Triethanolamine, Trolamine, Trolamine salicylate, 2-Chloroethyl vinyl ether, 2-[4-(Dimethylamino)phenyl]ethanol, Tetraethylethylenediamine, Ammonium acetate, Ammonium chloride, Ammonium sulfate, Ammonium formate, Ammonium nitrate, Ammonium carbonate, Ammonium fluoride, Ammonium Persulphate, Ammonium sulfamate, Ammonium phosphate, 1-Acetylguanidine, general acid, or a combination thereof. Examples of the inhibitor components include 1-Chlorobenzotriazole, 5-Chlorobenzotriazole, 5-Methyl-1H-benzotriazole, 1-methyl-1H-1,2,3-benzotriazole-5-carbaldehyde, 1-Methyl-1H-1,2,3-benzotriazol-5-amine, 1-Methylimidazole, 2-Mercapto-1-methylimidazole, 1-Methylimidazole-2-sulfonyl chloride, 5-Chloro-1-methylimidazole, 5-Iodo-1-methylimidazole, Thiamazole, 1-Methylimidazolium chloride, 2,5-Dibromo-1-methyl-1H-imidazole, 1H-Benzotriazole-4-sulfonic acid, the like, or a combination thereof.

Figure 3A:
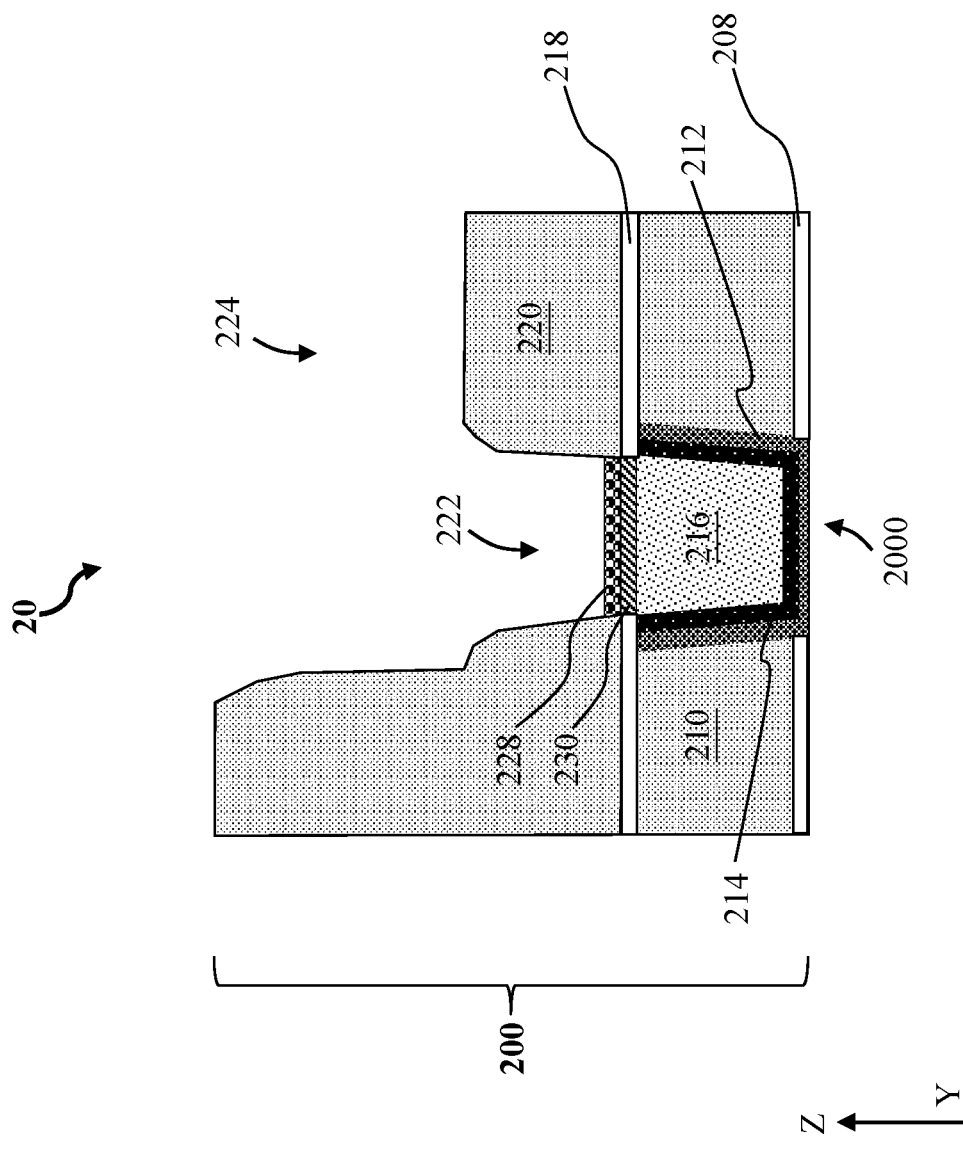

Referring to FIGS. 1 and 3A, the method 100 may optionally include a block 106 where a catalytic metal layer 230 may be formed over the exposed contact feature 2000. In some embodiments, the catalytic metal layer 230 may have a composition different from that of the barrier layer 212, the liner 214, or the metal fill layer 216. The composition of the catalytic metal layer 230 is selected such that a substantially defect-free graphene layer may be formed thereon at a low process temperature. In some implementations, the catalytic metal layer 230 may include nickel (Ni), cobalt (Co), copper (Cu), ruthenium (Ru), rhenium (Re), rhodium (Rh), palladium (Pd), iridium (Jr), platinum (Pt), gold (Au), an alloy thereof, or other suitable metal. In some instances, the catalytic metal layer 230 may be formed using ALD, CVD, PVD, plasma-enhanced CVD (PECVD), or plasma-enhanced ALD (PEALD) to a thickness between about 10 Å and about 70 Å. The catalytic metal layer 230 is monocrystalline such that it may serve as a smooth and chemically uniform substrate for graphene formation. A top surface of the catalytic metal layer 230 may be or include a hexagonal close-packed surface that is similar to the hexagonal lattice of carbon atoms in a graphene layer. Examples of such surfaces include the hexagonal close-packed (HCP) (0001) plane of ruthenium, the face-centered cubic (FCC) (111) plane of iridium, the FCC (111) plane of platinum, the FCC (111) plane of nickel, the FCC (111) plane of platinum, the HCP (0001) plane of cobalt, the FCC (111) plane of copper, the FCC (110) plane of iron, the FCC (111) plane of gold, the FCC (111) plane of palladium, the HCP (1010) plane of rhenium, and the FCC (111) plane of rhodium. In some implementations, the formation of the catalytic metal layer 230 does not include any lithography steps and is performed in a selective, bottom-up, or self-aligned manner. In that regard, the precursors and formation process of the catalytic metal layer 230 are selected such that the precursors selectively deposit on the metal surface of the exposed contact feature 2000 and the catalytic metal layer 230 thickens from the bottom up. In some instances, the dielectric sidewalls of the via opening 222 and the trench 224 may be substantially free of the catalytic metal layer 230.

Figure 3B:
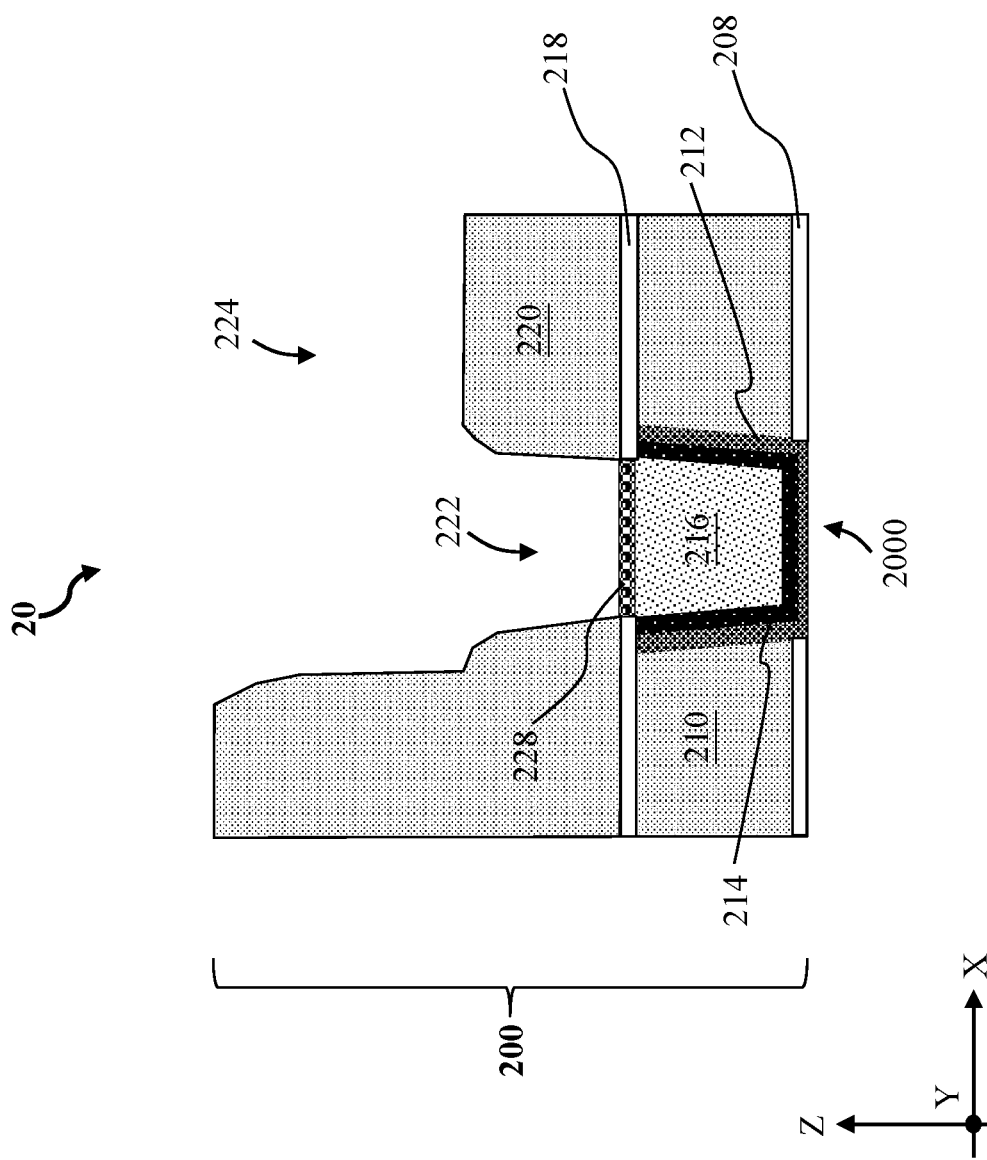

Referring to FIGS. 1, 3A and 3B, the method 100 includes a block 108 where a graphene layer 228 is formed over the exposed contact feature 2000. In embodiments where the catalytic metal layer 230 is formed as illustrated in FIG. 3A, the graphene layer 228 is formed directly on the catalytic metal layer 230. In other embodiments where the catalytic metal layer 230 is not formed as illustrated in FIG. 3B, the graphene layer 228 is formed directly on the exposed contact feature 2000. In embodiments where the catalytic metal layer 230 is formed, the metal fill layer 216 may be formed of cobalt, nickel, copper, ruthenium, platinum, or gold. In embodiments, where the catalytic metal layer 230 is formed, the composition of the metal fill layer 216 is different from the composition of the catalytic metal layer 230. In some implementations, the graphene layer 228 may be deposited using ALD or CVD. In some other implementation, the graphene layer 228 is deposited using PE-ALD or PE-CVD such that the deposition of the graphene layer 228 is facilitated and enhanced by use of plasma. In some embodiments, at block 108, hydrocarbon precursor gases ($C_xH_y$) such as methane or ethene, may be directed to the surface of the exposed contact feature 2000 while the semiconductor device 20 is annealed at an anneal temperature between about 25° C. and about 1200° C., including between about 200° C. and about 1200° C. In some conventional method of forming a graphene layer, the anneal temperature is high, such as greater than 1200° C., and such high anneal temperature prevents integration of the graphene layer formation with the IC fabrication processes as the thermal budget may easily be exceeded, resulting in damages to formed structures. In some embodiments of the present disclosure, plasma of the hydrocarbon precursor gases is ignited to facilitate the formation of the graphene layer 228 and the anneal temperature at block 108 may be lowered to a sufficiently low range, such as between about 25° C. and about 1000° C. The lowered anneal temperature range makes it possible for embodiments of the present disclosure to integrate the graphene formation step into method 100, without exceeding the thermal budget of the IC device fabrication processes and causing damages to structures that have already been formed, such as FEOL structures.

At block 108, the hydrocarbon precursor gas, such as methane or ethene, may diffuse to the surface of the metal fill layer 216 or the catalytic metal layer 230 and get absorbed at the surface. Then the hydrocarbon precursor gas decomposes on the surface due to pyrolysis to form active carbon species to form the graphene layer 228 on the surface. Inactive species, such as hydrogen, may be desorbed from the surface, form molecular hydrogen, and be removed by a purge gas, such as argon or other suitable inert gas. In some implementations, the pressure at block 108 may be between 0.1 Torr and about 760 Torr, the flow rate of the hydrocarbon precursor gas may be between 100 standard cubic centimeter (sccm) and about 10,000 sccm. In instances where the process to form the graphene layer 228 is enhanced by plasma, the transformer coupled plasma (TCP) has a power between about 50 W and about 1000 W.

Figure 4A:
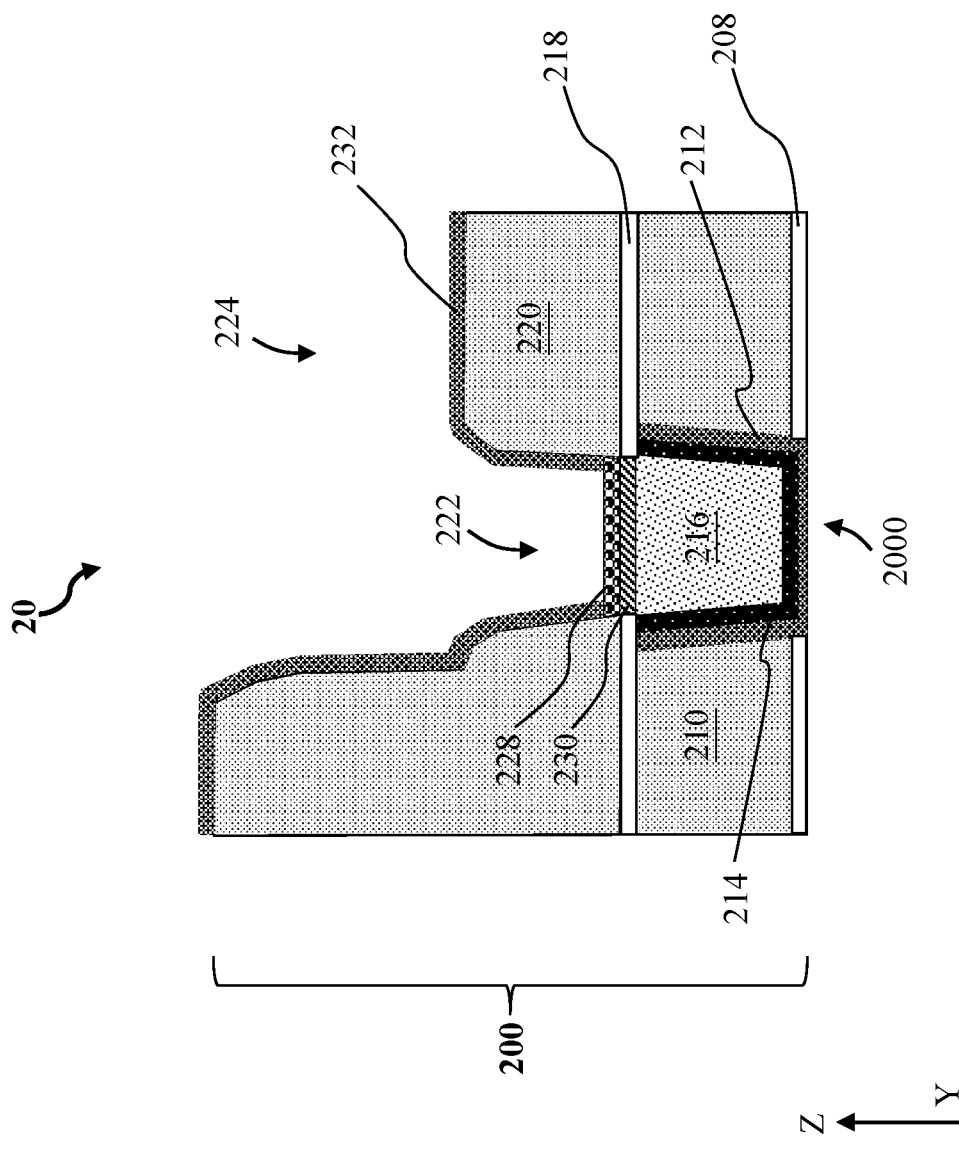
Figure 4B:
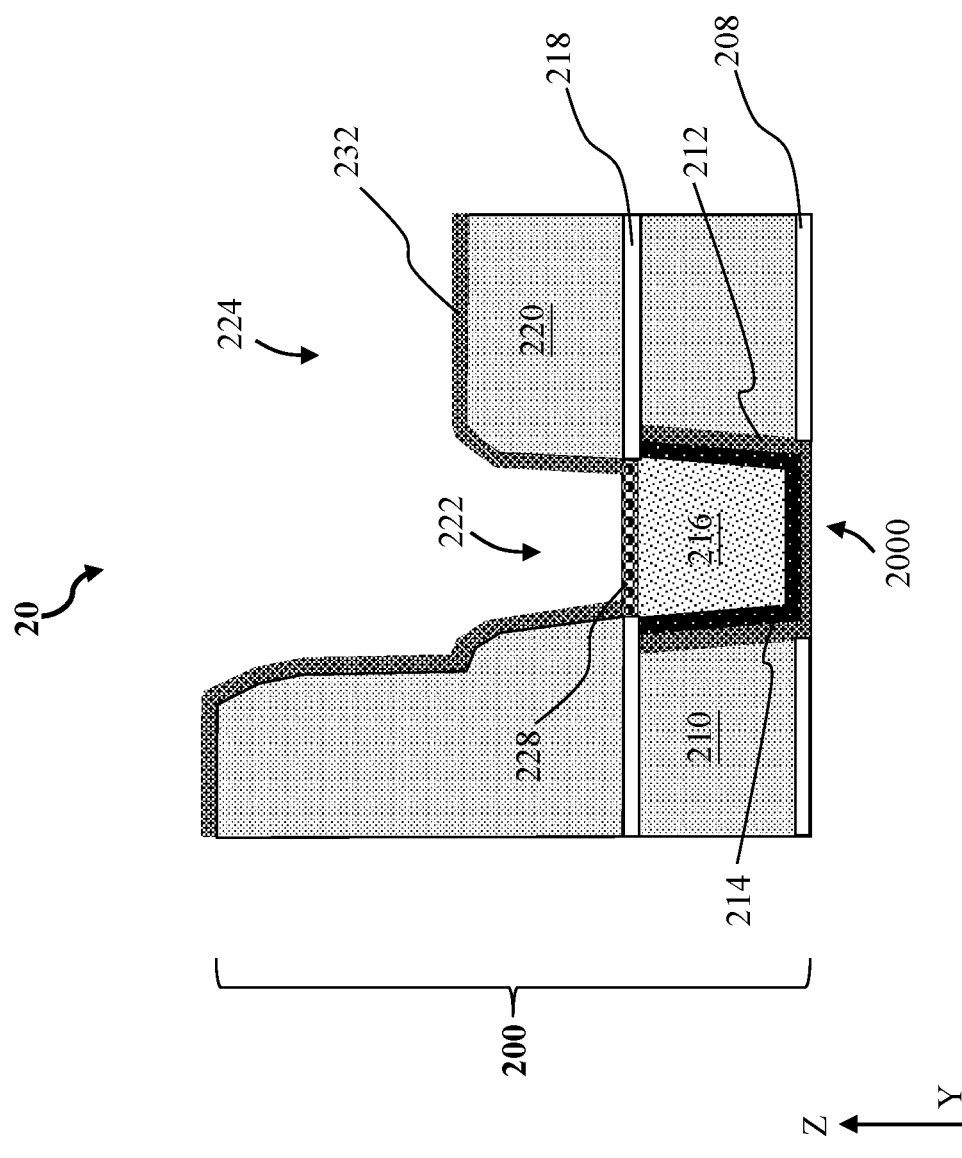

Referring to FIGS. 1A, 4A and 4B, the method 100 includes a block 110 where the first barrier layer 232 is selectively deposited over surfaces of semiconductor device 20 except for surfaces of the graphene layer 228. In some embodiments, the precursors and processes for formation of the first barrier layer 232 are selected such that that the first barrier layer 232 is selectively deposited on surfaces of the second dielectric layer 220, including sidewalls of the via opening 222 and the trench 224; and the top surface of graphene layer 228 is substantially free of the first barrier layer 232. In this regard, because the graphene layer 228 is inert and does not readily react with other atoms, precursors of the first barrier layer 232 do not bond to the graphene layer 228 (i.e. the graphene layer 228 repels the precursors of the first barrier layer 232), the graphene layer 228 functions as a blocking layer for the first barrier layer 232.

In some embodiments, the first barrier layer 232 may be formed of metal alloy such as cobalt-tungsten alloy (CoW), cobalt-manganese alloy (CoMn), copper-aluminum alloy (CuAl), nickel-aluminum alloy (NiAl), a combination thereof, or other suitable metal alloy. In some other embodiments, the first barrier layer 232 may be formed of metal nitride such as tantalum nitride (TaN), titanium nitride (TiN), cobalt nitride (CoN), tungsten nitride (WN), ruthenium nitride (RuN), nickel nitride (NiN), a combination thereof, or other suitable metal nitride. The first barrier layer 232 so formed can block oxygen diffusion, and may be deposited using ALD, CVD, or ELD and may be formed to a thickness between about 3 Å and about 50 Å. The catalytic metal layer 230 is formed between the contact feature 2000 and the graphene layer 228 in the embodiments illustrated in FIG. 4A but is not in the embodiments illustrated in FIG. 4B.

Figure 5A:
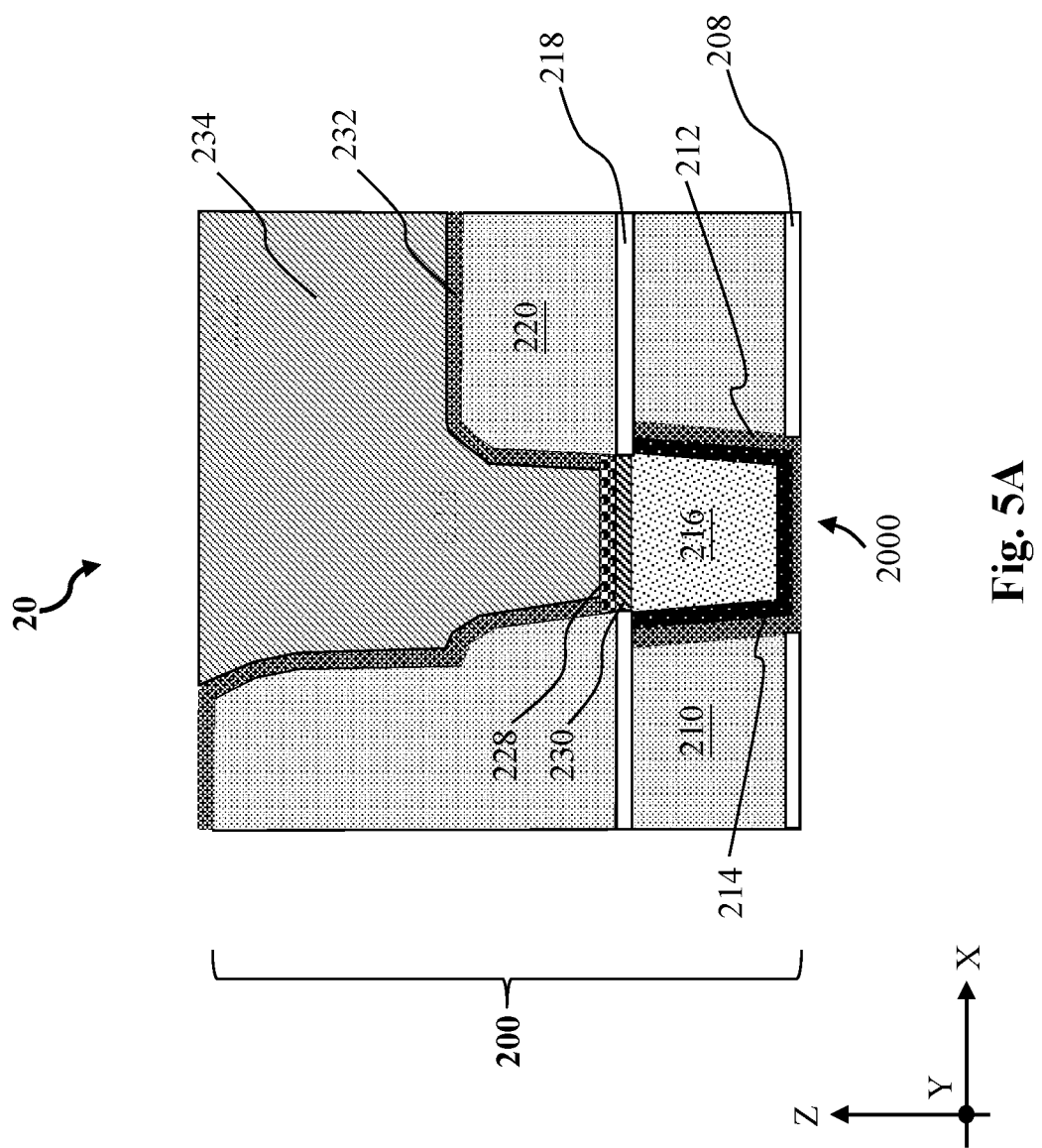
Figure 5B:
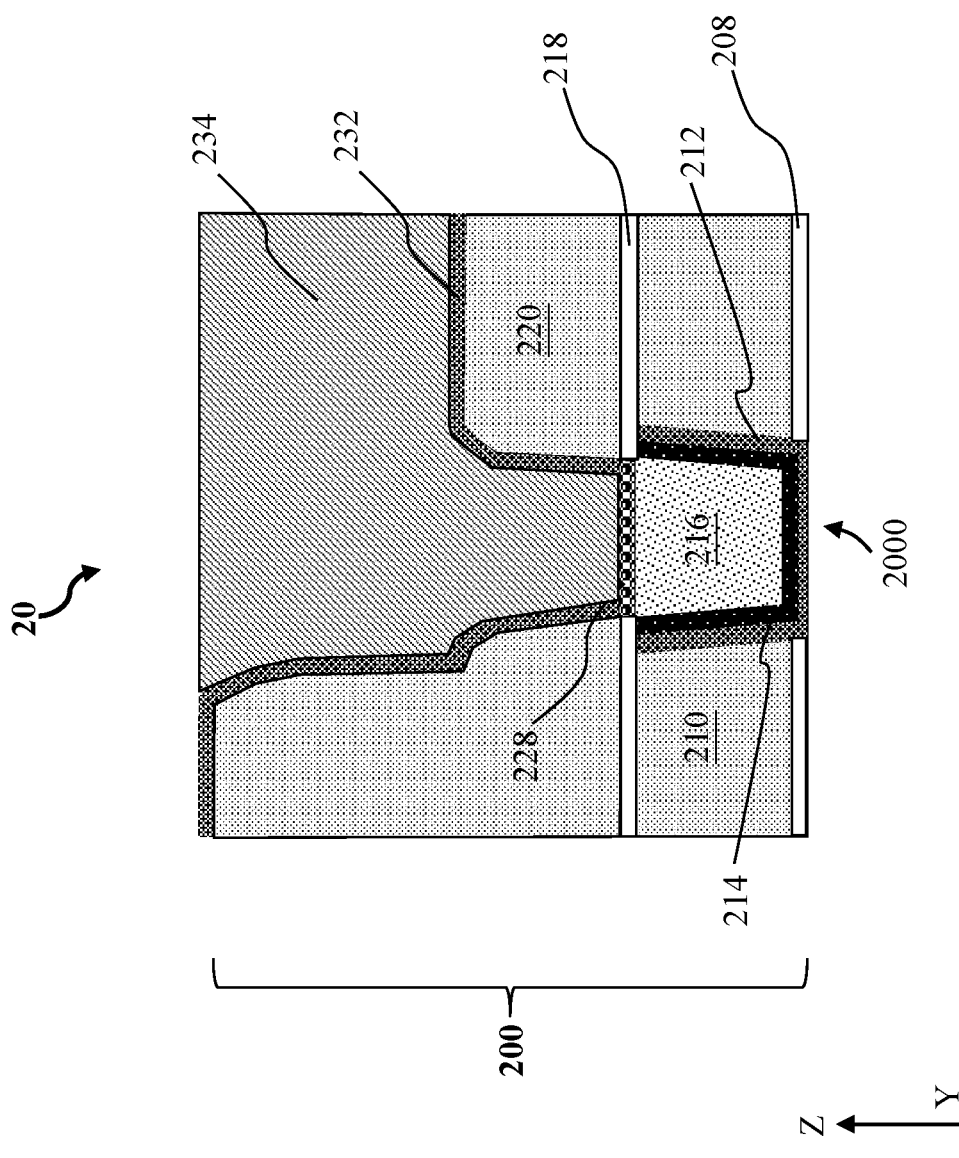

Referring to FIGS. 1, 5A and 5B, the method 100 include a block 112 where a metal fill layer 234 is deposited in the via opening 222 and the trench 224. In some embodiments, the metal fill layer 234 may be deposited using ALD, CVD, PVD, electroless plating, or electroplating, or other suitable technique. In some implementations, the metal fill layer 234 may be formed of any suitable conductive material, such as tungsten (W), nickel (Ni), iridium (Ir), osmium (Os), gold (Au), palladium (Pd), platinum (Pt), silver (Ag), tantalum (Ta), titanium (Ti), aluminum (Al), copper (Cu), cobalt (Co), tantalum nitride (TaN), titanium nitride (TiN), ruthenium (Ru), or alloys thereof. In some embodiments, the workpiece may be subject to a planarization process, such as a CMP process, to remove excess metal fill layer 234 and excess first barrier layer 232 over top surfaces of the second dielectric layer 220 to provide a planarized top surface as illustrated in FIGS. 5A and 5B.

In some embodiments, because the operations at block 108 may require high process temperature, processes temperatures for formation of the metal fill layer 216, the first dielectric layer 210, the second dielectric layer 220, and the metal fill layer 234 of the present disclosure may be below about 500° C., such as below about 425° C., in order to control the thermal budget or to meet thermal budget goals.

Referring to FIG. 1, the method 100 may include a block 114 where further processes are performed. In some embodiments, the further processes may include processes for forming additional interconnect structures over the interconnect structure 200. For example, such further processes may include deposition of another CESL, deposition of another dielectric layer, formation of via openings, formation of trenches, deposition of barrier layers, deposition of liners, and deposition of metal fill layers.

Figure 6:
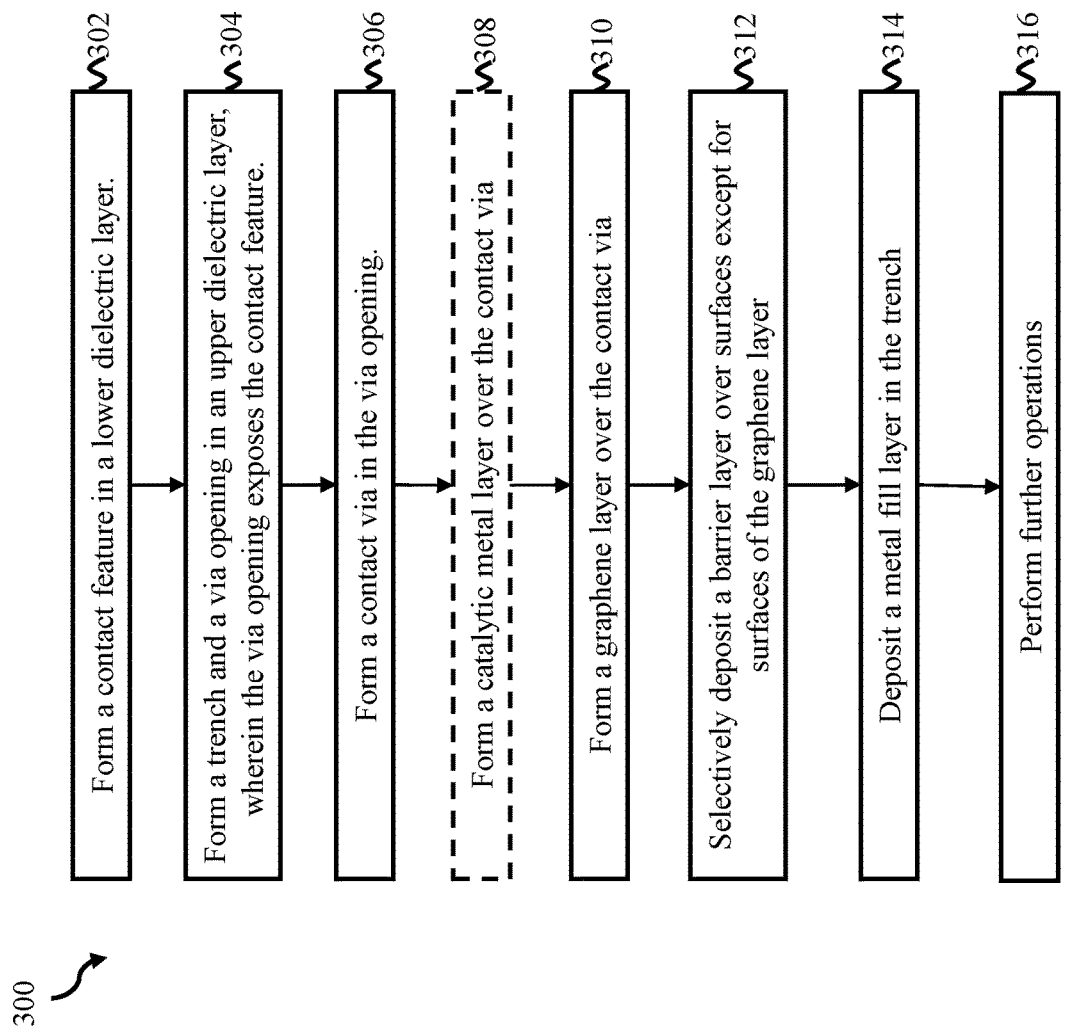
FIG. 6 is a flow chart of a method for fabricating a middle-end-of-line (MEOL) contact structure according to various aspects of the present disclosure.

FIG. 6 illustrates a flow chart of a method 300 for fabricating an MEOL contact structure of a semiconductor device according to various aspects of the present disclosure. FIG. 6 will be described below in conjunction with FIGS. 7, 8, 9A, 9B, 10A, 10B, 11A, and 11B, which are fragmentary cross-sectional views of an MEOL contact structure of a semiconductor device at various stages of fabrication according to method 300 in FIG. 6. Additional steps can be provided before, during, and after method 300, and some of the steps described can be moved, replaced, or eliminated for additional embodiments of method 300. Additional features can be added in the MEOL contact structure depicted in FIGS. 7, 8, 9A, 9B, 10A, 10B, 11A, and 11B, and some of the features described below can be replaced, modified, or eliminated in other embodiments of the MEOL contact structure. It is noted that methods 100 and 300 are separately described to demonstrate that methods according to the present disclosure may be applied to MEOL contact structures, BEOL interconnect structures, or contact structures that couple the MEOL contact structures to the BEOL interconnect structures. Both the methods 100 and 300 utilize a graphene layer, such as the graphene layer 228, as a blocking layer for a barrier layer, such as the barrier layer 332, to implement selective deposition/formation of the barrier layer on sidewalls of dielectric layers exposed in trenches and via openings. Additionally, both the methods 100 and 300 may include optional operations to deposit a catalytic metal layer, such as the catalytic metal layer 330, to serve as a substrate for formation of the graphene layer. Aspects of the method 300 that are described above with respect to the method 100 will not be repeated.

Figure 7:
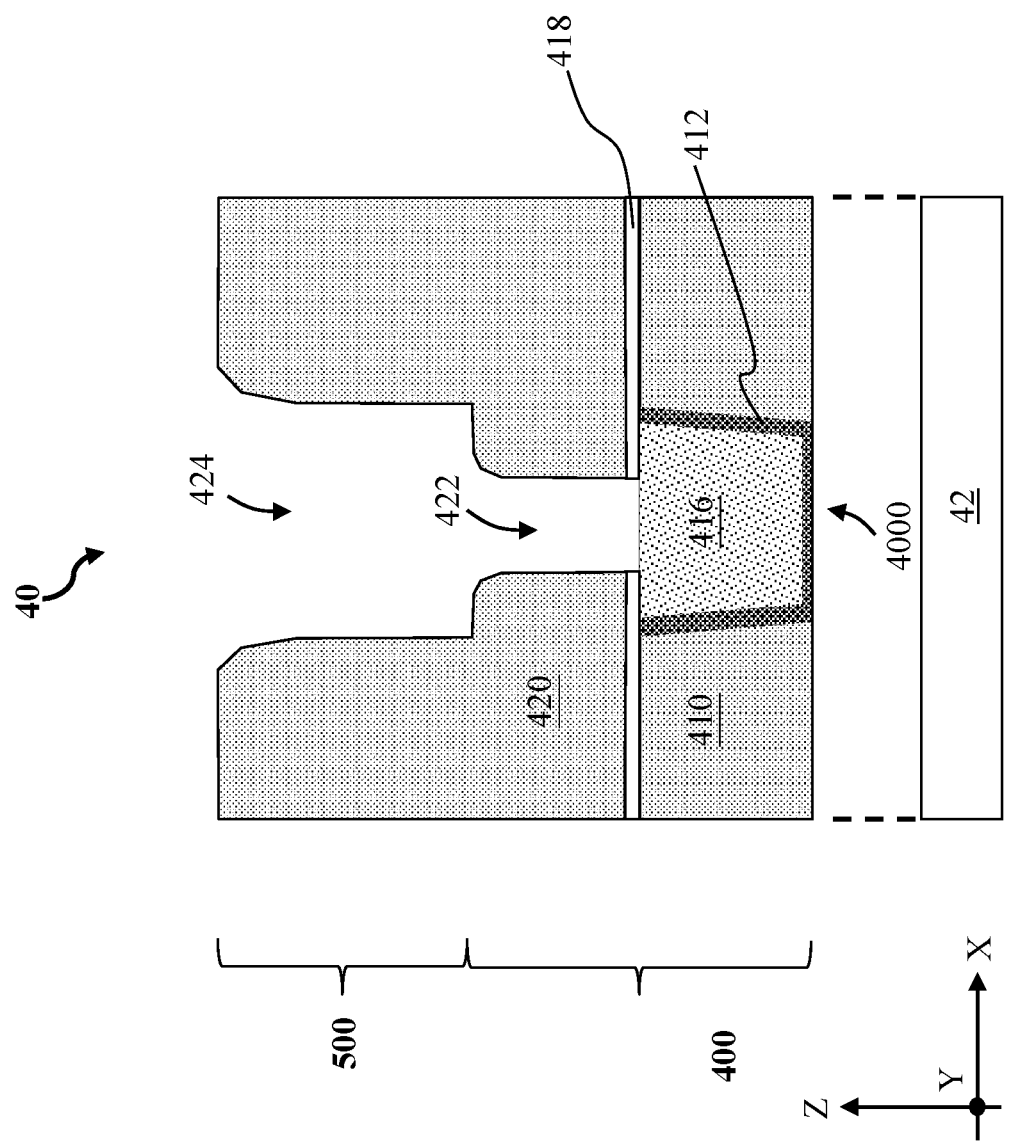
FIGS. 7, 8, 9A, 9B, 10A, 10B, 11A, and 11B are fragmentary cross-sectional views of an MEOL contact structure of a semiconductor device at various stages of fabrication, according to various aspects of the present disclosure.

Referring now to FIGS. 6 and 7, the method 300 includes a block 302 where a contact feature 4000 is formed in a lower dielectric layer 410 of an MEOL contact structure 400 in a semiconductor device 40. The MEOL contact structure 400 electrically couples the FEOL features, such as the gate structures and source/drain features, to the BEOL interconnect structures, such as the interconnect structure 200. The contact feature 4000 represents a source/drain contact or a gate contact. While only one contact feature 4000 is shown in FIG. 7 for ease of illustration, the MEOL contact structure 400 may include a plurality of contact features 4000, such as a plurality of source/drain contacts and gate contacts. The contact feature 4000 may be adjacent to another source/drain contact or gate contact and separated therefrom by a portion of the lower dielectric layer 410, one or more spacers, or one or more liners. The lower dielectric layer 410 is an ILD layer and may therefore be referred to as a lower ILD layer 410. The semiconductor device 40 includes a substrate 42 and the MEOL contact structure 400 may include a contact etch stop layer (CESL) 418 over the lower dielectric layer 410. The semiconductor device 40, the lower dielectric layer 410, the CESL 418, and the substrate 42 may be similar to the semiconductor device 20, the first dielectric layer 210, the CESL 218, and the substrate 22, respectively and their compositions and formation processes will not be repeated here for brevity. In addition, for simplicity, the substrate 42 is not illustrated in FIGS. 8, 9A, 9B, 10A, 10B, 11A, and 11B.

In some embodiments illustrated in FIG. 7, the contact feature 4000 may include a barrier layer 412 and a metal fill layer 416. The barrier layer 412 and the metal fill layer 416 are similar to the barrier layer 212 and the metal fill layer 216 and descriptions of their compositions and formation will not be repeated here. After deposition and planarization of the top surfaces of the lower dielectric layer 410, the barrier layer 412, and the metal fill layer 416, the CESL 418 is deposited over the lower dielectric layer 410 and an upper dielectric layer 420 may be deposited over the CESL 418.

Referring still to FIGS. 6 and 7, the method 300 includes a block 304 where a via opening 422 and a trench 424 are formed in an upper dielectric layer 420 that is formed over the lower dielectric layer 410 such that the via opening 422 exposes the contact feature 4000. In some embodiments, the trench 424 is larger than the via opening 422 in dimensions along the X direction and/or the Y direction. The trench 424 may be utilized to form a conductive line (or metal line) that extends along the X direction or the Y direction. In some representative implementations shown in FIG. 7, the contact feature 4000 is exposed through the via opening 422 in the bottom surface of the trench 424. In some embodiments, the via opening 422 and the trench 424 may be formed by dry etch, wet etch, or other suitable etching technique. The via opening not only extends through the upper dielectric layer 420 but also the CESL 418.

Figure 8:
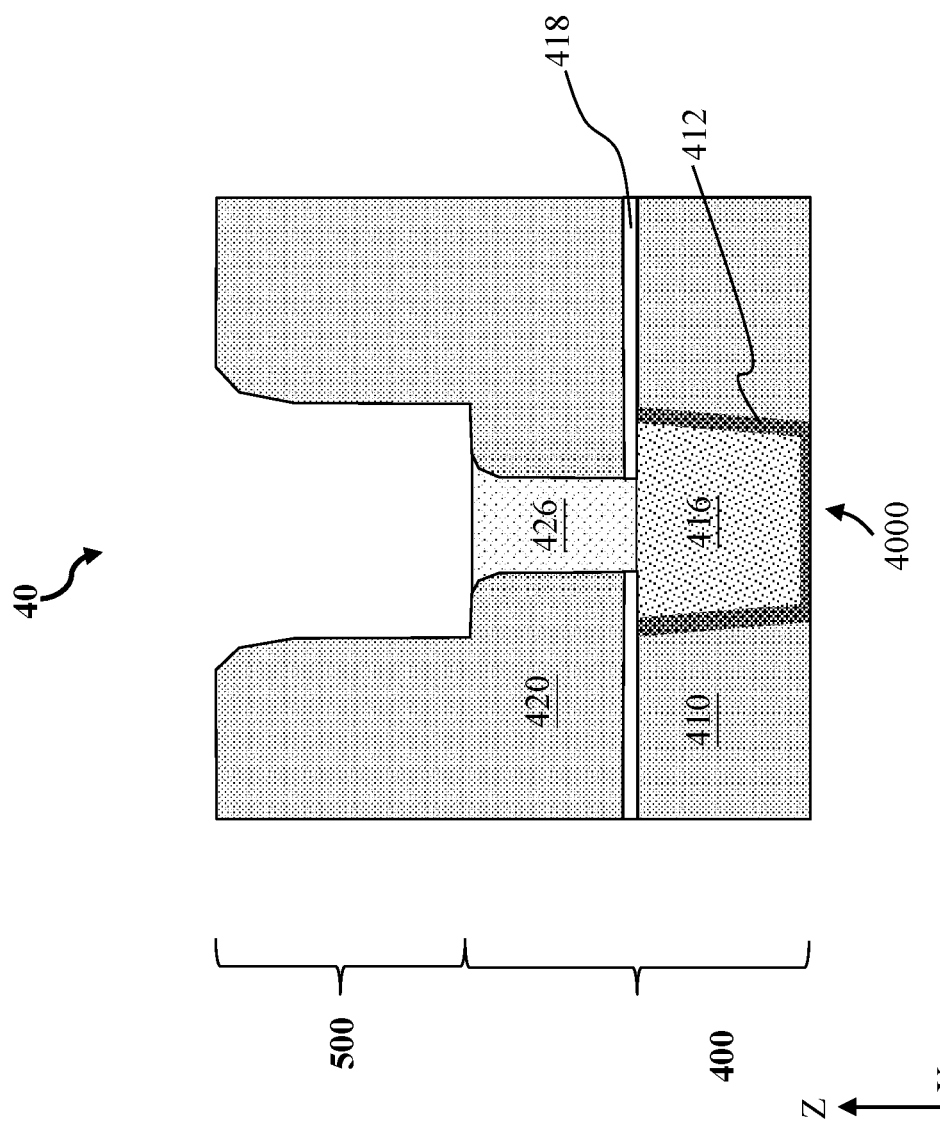

Referring now to FIGS. 6 and 8, the method 300 includes a block 306 where a contact via 426 is formed in the via opening 422. The contact via 426 may also be referred to as the via plug 426. In some embodiments, the contact via 426 may be formed by depositing metal in the via opening 422 in a selective, bottom-up, or self-aligned manner. In that regard, the precursors and formation process of the contact via 426 are selected such that the precursors of the metal selectively deposit on the metal surface of the exposed contact feature 4000 and the metal deposited in the via opening 422 thickens from the bottom up to form the contact via 426. As illustrated in FIG. 8, contact via 426 is a part of the MEOL contact structure 400 and electrically bridges the contact feature 4000 to BEOL interconnect structure 500 over the MEOL contact structure 400. The contact via 426 may be formed of tungsten (W), nickel (Ni), iridium (Jr), osmium (Os), gold (Au), palladium (Pd), platinum (Pt), silver (Ag), tantalum (Ta), titanium (Ti), aluminum (Al), copper (Cu), cobalt (Co), tantalum nitride (TaN), titanium nitride (TiN), ruthenium (Ru), or alloys thereof.

Figure 9A:
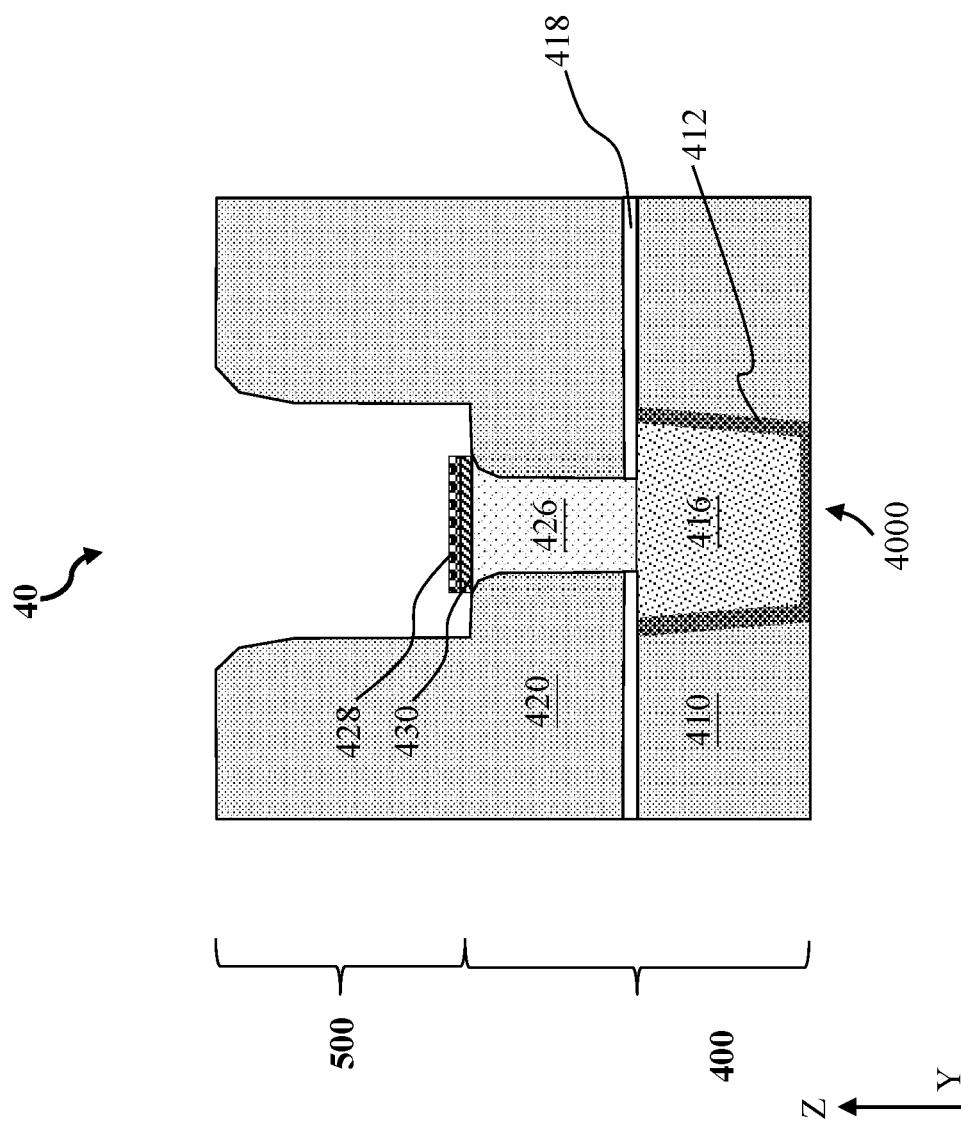

Referring now to FIGS. 6 and 9A, the method 300 may, in some embodiments, include a block 308 where a catalytic metal layer 430 is optionally formed over a top surface of the contact via 426. In those embodiments, the catalytic metal layer 430 has a composition different from that of the barrier layer 412 and the metal fill layer 416. The catalytic metal layer 430 is similar to the catalytic metal layer 230 described above with respect to method 100 at least in terms of composition, surface properties, and formation processes and will not be repeatedly described here. In some alternative embodiments, the metal fill layer 416 itself provides a smooth and chemically uniform substrate for graphene formation and formation of the catalytic metal layer 430 is omitted.

Figure 9B:
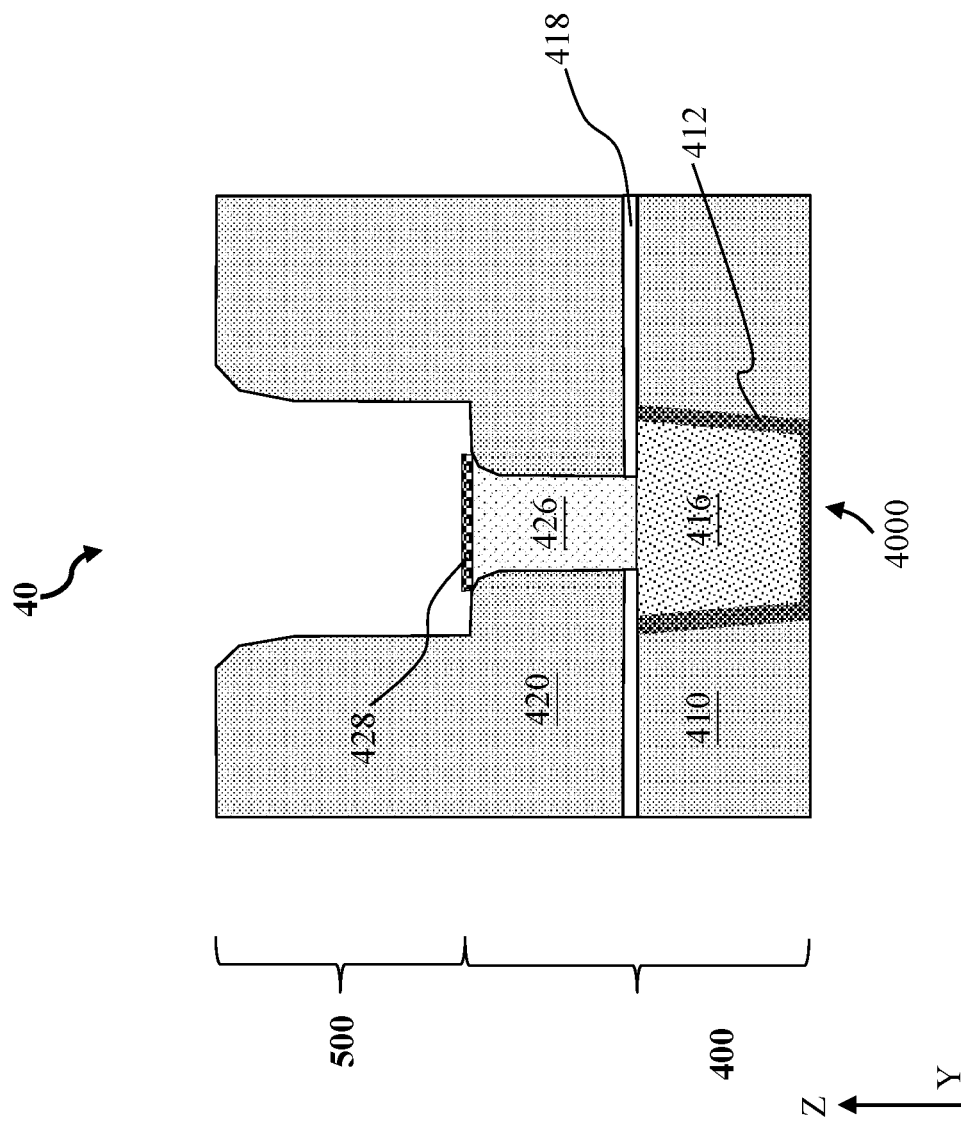

Referring now to FIGS. 6, 9A and 9B, the method 300 includes a block 310 where a graphene layer 428 is formed over the top surface of the contact via 426. In embodiments where the catalytic metal layer 430 is formed as illustrated in FIG. 9A, the graphene layer 428 is formed directly on the catalytic metal layer 430. In other embodiments where the catalytic metal layer 430 is not formed as illustrated in FIG. 9B, the graphene layer 428 is formed directly on the top surface of contact via 426. In some implementations, the graphene layer 428 may be deposited using ALD, CVD, PE-ALD, or PE-CVD. In some embodiments, at block 310, hydrocarbon precursor gases ($C_xH_y$) such as methane or ethene, may be directed to the surface of the contact via 426 while the semiconductor device 40 is annealed at an anneal temperature between about 25° C. and about 1200° C., including between about 200° C. and about 1200° C. At block 310, the hydrocarbon precursor gas, such as methane or ethene, may diffuse to the surface of the contact via 426 or the catalytic metal layer 430 and get absorbed at the surface (of the contact via 426 or the catalytic metal layer 430). Then the hydrocarbon precursor gas decomposes on the surface due to pyrolysis to form active carbon species to form the graphene layer 428 on the surface (of the contact via 426 or the catalytic metal layer 430). Inactive species, such as hydrogen, may be desorbed from the surface, form molecular hydrogen, and be removed by a purge gas, such as argon or other suitable inert gas. In some implementations, the pressure at block 310 may be between 0.1 Torr and about 760 Torr, the flow rate of the hydrocarbon precursor gas may be between 100 standard cubic centimeter (sccm) and about 10,000 sccm. In instances where the process to form the graphene layer 428 is enhanced by plasma, the transformer coupled plasma (TCP) has a power between about 50 W and about 1000 W.

Figure 10A:
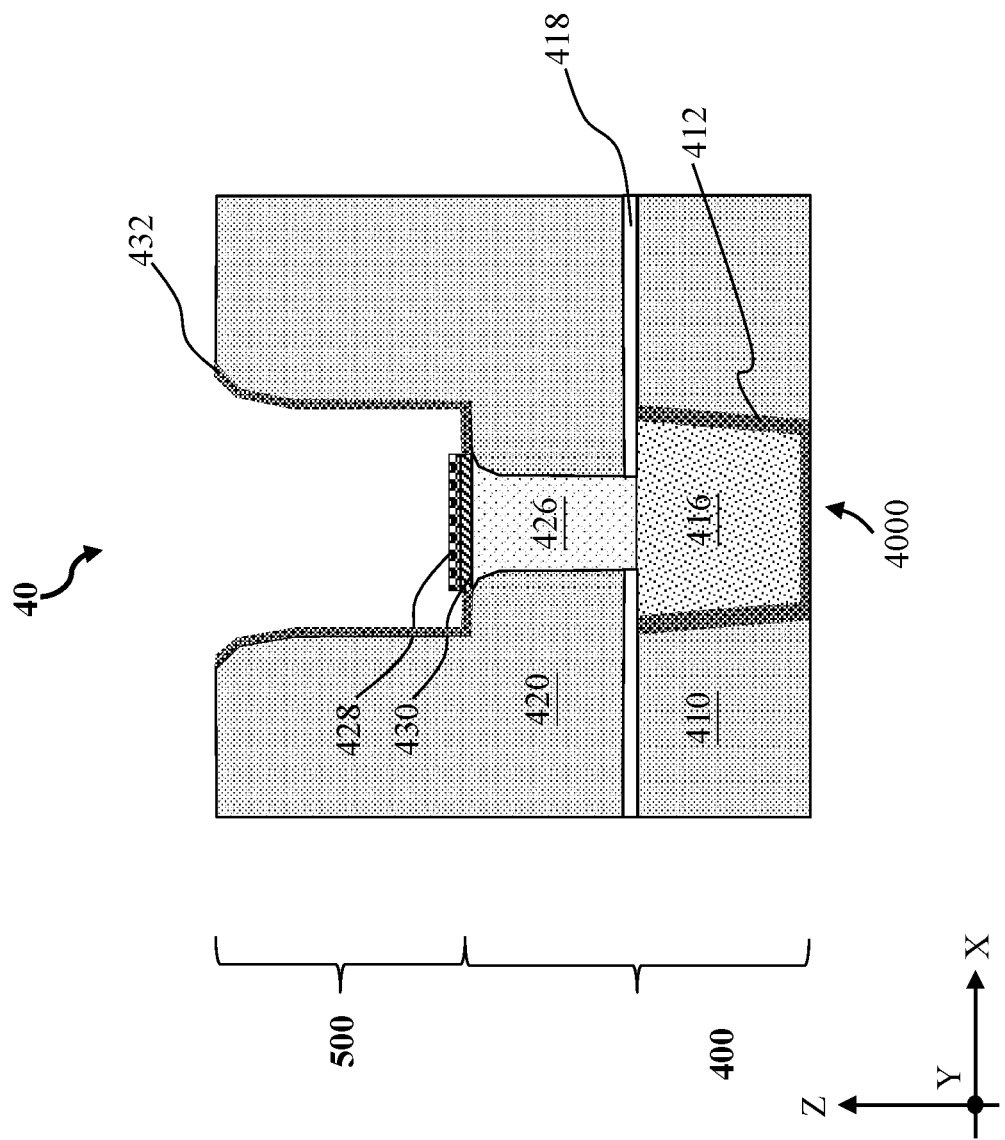
Figure 10B:
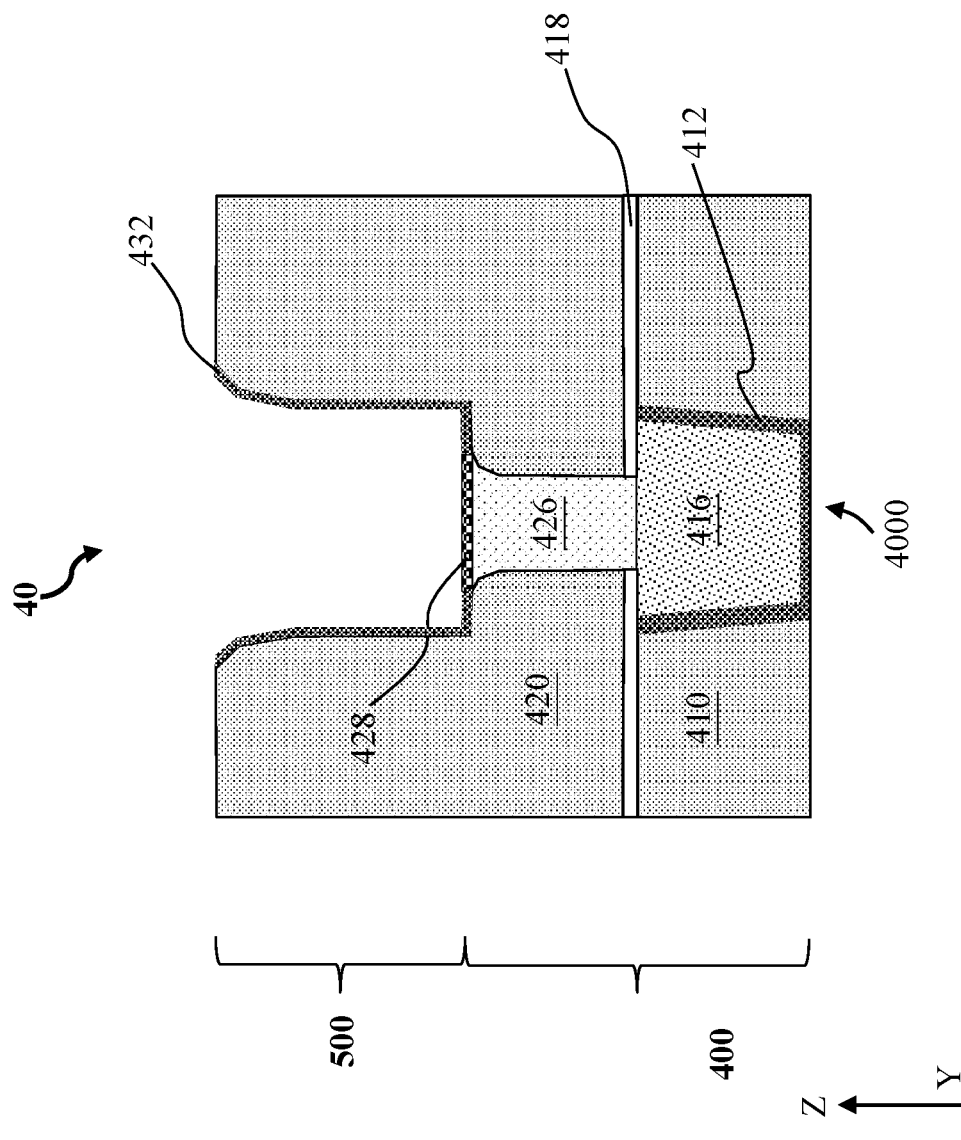

Referring now to FIGS. 6, 10A and 10B, the method 300 includes a block 312 where a barrier layer 432 is selectively deposited over surfaces except for surfaces of the graphene layer 428. In some embodiments, the precursors and processes for formation of the barrier layer 432 are selected such that that the barrier layer 432 is selectively deposited on surfaces of the upper dielectric layer 420, including sidewalls of the trench 424; and the top surface of graphene layer 428 is substantially free of the barrier layer 432. In this regard, because precursors of the barrier layer 432 have low affinity to the graphene layer 428 (i.e. the graphene layer 428 repels the precursors of the barrier layer 432), the graphene layer 428 functions as a blocking layer for the barrier layer 432. In some embodiments, the barrier layer 432 may be formed of metal alloy such as cobalt-tungsten alloy (CoW), tungsten nitride (WN), cobalt-manganese alloy (CoMn), copper-aluminum alloy (CuAl), nickel-aluminum alloy (NiAl), a combination thereof, or other suitable metal alloy. In some other embodiments, the barrier layer 432 may be formed of metal nitride such as tantalum nitride (TaN), titanium nitride (TiN), cobalt nitride (CoN), nickel nitride (NiN), a combination thereof, or other suitable metal nitride. The barrier layer 432 so formed can block oxygen diffusion, and may be deposited using ALD, CVD, or ELD and may be formed to a thickness between about 3 Å and about 50 Å. The catalytic metal layer 430 is formed between the contact via 426 and the graphene layer 428 in the embodiments illustrated in FIG. 10A but is not in the embodiments illustrated in FIG. 10B.

Figure 11A:
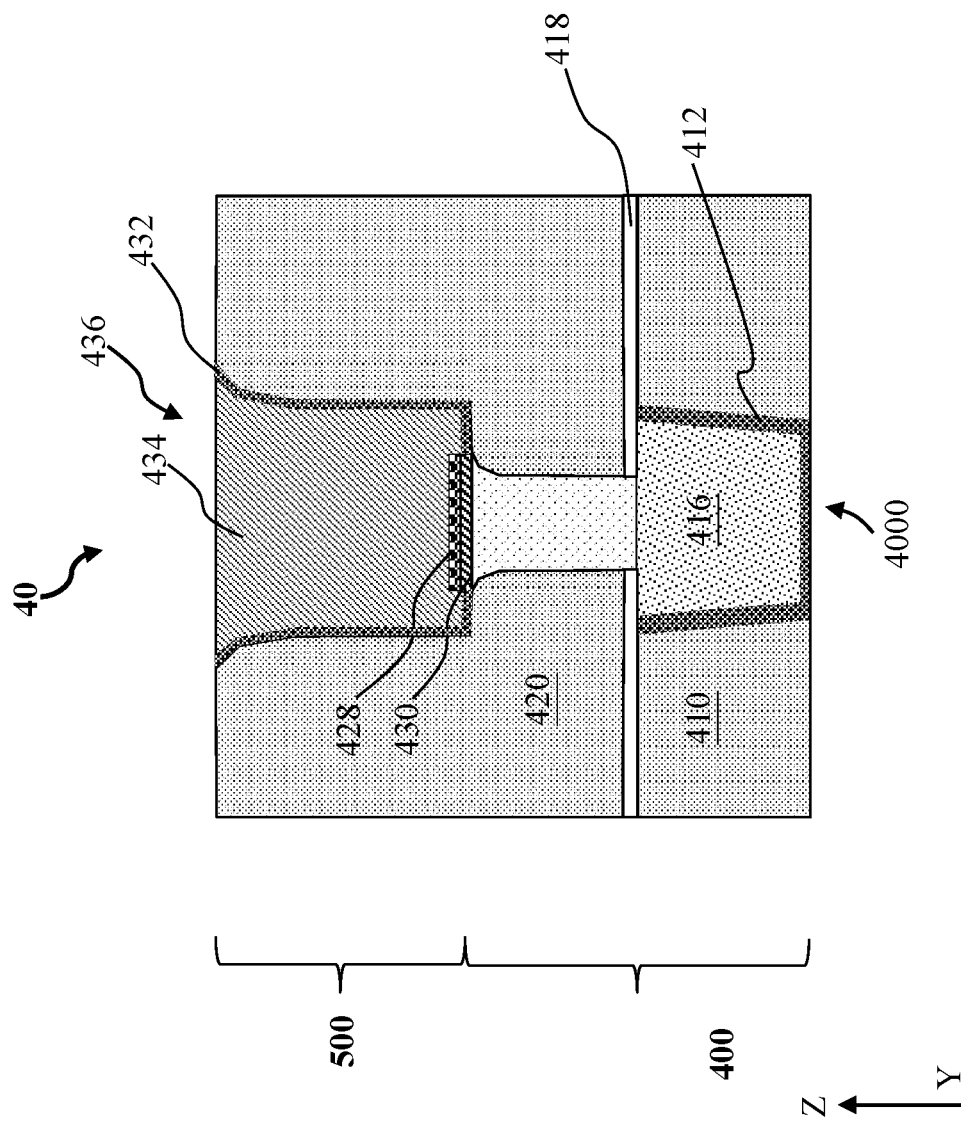
Figure 11B:
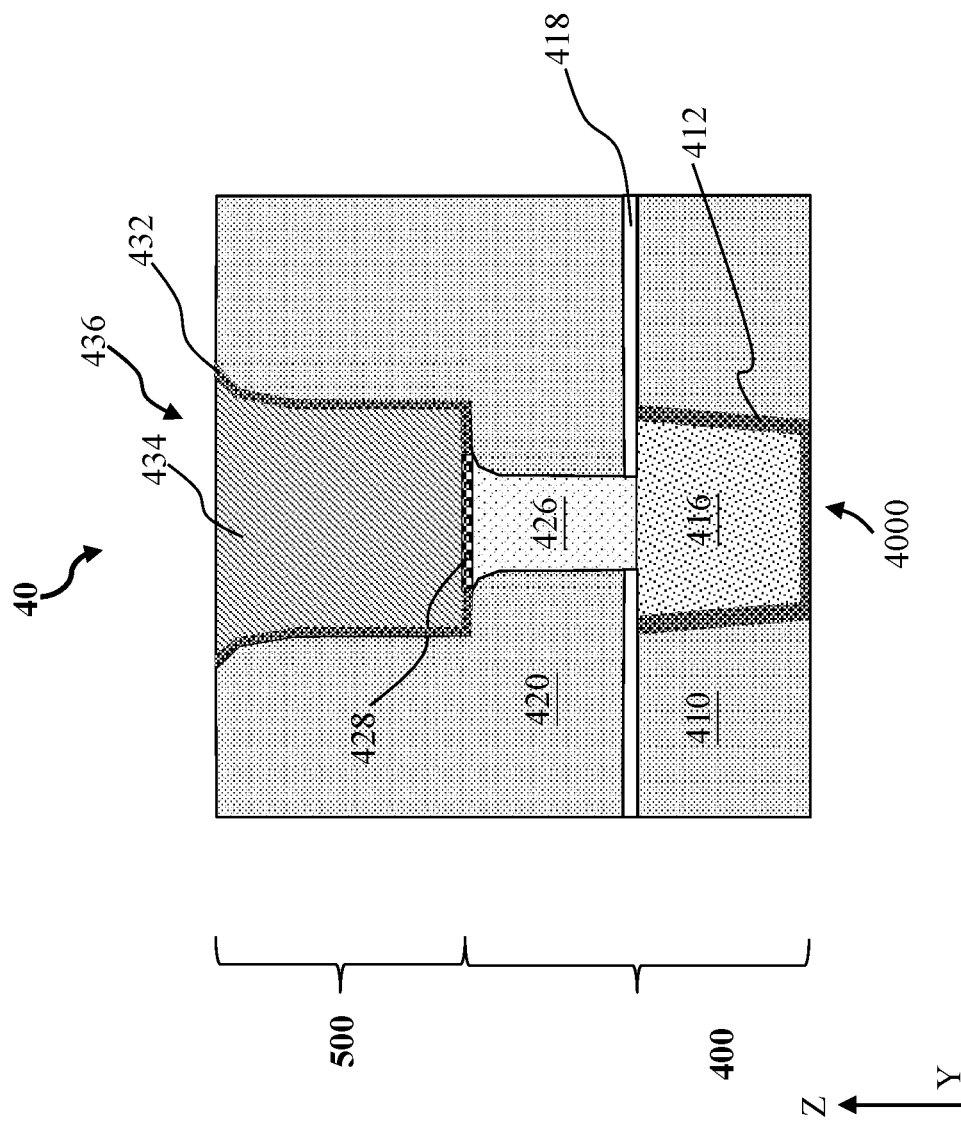

Referring now to FIGS. 6, 11A and 11B, the method 300 may include a block 314 where a metal fill layer 434 is deposited in the trench 424, including over the barrier layer 432. In some embodiments, the metal fill layer 434 may be deposited using ALD, CVD, PVD, electroless plating, or electroplating, or other suitable technique. In some implementations, the metal fill layer 434 may be formed of any suitable conductive material, such as tungsten (W), nickel (Ni), iridium (Ir), osmium (Os), gold (Au), palladium (Pd), platinum (Pt), silver (Ag), tantalum (Ta), titanium (Ti), aluminum (Al), copper (Cu), cobalt (Co), tantalum nitride (TaN), titanium nitride (TiN), ruthenium (Ru), or alloys thereof. In some embodiments, the workpiece may be subject to a planarization process, such as a CMP process, to remove excess metal fill layer 434 and the barrier layer 432 over top surfaces of the upper dielectric layer 420 to provide a planarized top surface as illustrated in FIGS. 11A and 11B. At this point, a conductive feature 436 is formed and the conductive feature 436 is part of the BEOL interconnect structure 500, which is disposed over the MEOL contact structure 400.

Referring to FIG. 6, the method 300 may include a block 316 where further processes are performed. In some embodiments, the further processes may include processes for forming additional BEOL interconnect structures over the BEOL interconnect structure 500. For example, such further processes may include deposition of another CESL, deposition of another dielectric layer, formation of via openings, formation of trenches, deposition of barrier layers, deposition of liners, and deposition of metal fill layers.

The MEOL contact structures and BEOL interconnect structures disclosed herein provide several benefits. In some embodiments, by forming a graphene layer either directly on a conductive metal surface or on a catalytic metal layer to block formation of barrier materials, the barrier layer can be selectively formed over sidewalls of via openings and trenches, while the graphene layer remains free of any barrier layer. Compared to the barrier layer, the superior conductivity of the graphene layer at the contact interface can greatly reduce contact resistance, decrease RC delay and improve device performance.

The present disclosure provides for many different embodiments. In one embodiments, an interconnect structure is provided. The interconnect structure includes a first contact feature in a first dielectric layer, a second dielectric layer over the first dielectric layer, a second contact feature over the first contact feature, a barrier layer between the second dielectric layer and the second contact feature, and a carbon layer disposed between the second contact feature and the first contact feature, the carbon layer being in contact with the second contact feature.

In some embodiments, the carbon layer comprises a graphene layer. In some implementations, the barrier layer includes cobalt-tungsten alloy, cobalt-manganese alloy, copper-aluminum alloy, nickel-aluminum alloy, or a combination thereof. In some instances, the barrier layer includes titanium nitride, tantalum nitride, cobalt nitride, tungsten nitride, ruthenium nitride, or a combination thereof. In some instances, the interconnect structure further includes a catalytic metal layer disposed between the carbon layer and the first contact feature. In some embodiments, the catalytic metal layer includes nickel, cobalt, copper, ruthenium, platinum, or gold. In some implementations, an interface between the carbon layer and the second contact feature is free of the barrier layer.

In another embodiment, an interconnect structure is provided. The interconnect structure includes a first contact feature in a first dielectric layer, a second dielectric layer over the first dielectric layer, a contact via over the first contact feature and surrounded by the second dielectric layer, a second contact feature over the contact via and surrounded by the second dielectric layer, a barrier layer between the second dielectric layer and the second contact feature, and a graphene layer disposed between the contact via and the second contact feature, the graphene layer being in contact with the second contact feature.

In some embodiments, the graphene layer does not extend between the second dielectric layer and the barrier layer. In some implementations, the barrier layer includes cobalt-tungsten alloy, cobalt-manganese alloy, copper-aluminum alloy, nickel-aluminum alloy, or a combination thereof. In some instances, the barrier layer includes titanium nitride, tantalum nitride, cobalt nitride, tungsten nitride, ruthenium nitride, or a combination thereof. In some instances, an interface between the graphene layer and the second contact feature is free of the barrier layer. In some implementations, the interconnect structure further includes a catalytic metal layer disposed between the graphene layer and the contact via. In some embodiments, the catalytic metal layer includes nickel, cobalt, copper, ruthenium, platinum, or gold. In some embodiments, the catalytic metal layer is different from the second contact feature in terms of composition.

In still another embodiment, a method is provided. The method includes forming a first contact feature in a first dielectric layer, forming a via opening and a trench in a second dielectric layer over the first dielectric layer to expose the first contact feature in the via opening, forming a graphene layer over the exposed first contact feature, selectively forming a barrier layer such that the barrier layer is disposed on sidewalls of the trench and a top surface of the graphene layer is free of the barrier layer, and depositing a metal fill layer in the via opening and the trench.

In some embodiments, the method further includes before the forming of the graphene layer, depositing a catalytic metal layer. In these embodiments, the catalytic metal layer includes nickel, cobalt, copper, ruthenium, platinum, or gold. In some implementations, the method further includes forming a via plug in the via opening in a bottom-up manner. In those implementations, the selectively forming of the barrier layer includes forming the barrier layer over a top surface of the via plug. In some embodiments, the forming of the graphene layer over the exposed first contact feature includes forming the graphene layer over the top surface of the via plug. In some instances, the method further includes before the forming of the graphene layer over the top surface of the via plug, depositing a catalytic metal layer on the top surface of the via plug.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnect structure comprising:
   a first contact feature in a first dielectric layer;
   a second dielectric layer over the first dielectric layer;
   a second contact feature over the first contact feature;
   a barrier layer between the second dielectric layer and the second contact feature; and
   a carbon layer disposed between the second contact feature and the first contact feature, the carbon layer being in contact with the second contact feature,
   wherein the barrier layer terminates over a top surface of the carbon layer and does not extend between the second contact feature and the carbon layer.

2. The interconnect structure of claim 1, wherein the carbon layer comprises a graphene layer.

3. The interconnect structure of claim 1, wherein the barrier layer comprises cobalt-tungsten alloy, cobalt-manganese alloy, copper-aluminum alloy, nickel-aluminum alloy, or a combination thereof.

4. The interconnect structure of claim 1, wherein the barrier layer comprises titanium nitride, tantalum nitride, cobalt nitride, tungsten nitride, ruthenium nitride, or a combination thereof.

5. The interconnect structure of claim 1, further comprising a catalytic metal layer disposed between the carbon layer and the first contact feature.

6. The interconnect structure of claim 5, wherein the catalytic metal layer comprises nickel, cobalt, copper, ruthenium, platinum, or gold.

7. The interconnect structure of claim 1, wherein an interface between the carbon layer and the second contact feature is free of the barrier layer.

8. An interconnect structure comprising:
   a first contact feature in a first dielectric layer;
   a second dielectric layer over the first dielectric layer;
   a contact via over the first contact feature and surrounded by the second dielectric layer;
   a second contact feature over the contact via and surrounded by the second dielectric layer;

a barrier layer between the second dielectric layer and the second contact feature; and a graphene layer disposed between the contact via and the second contact feature, the graphene layer being in contact with the second contact feature, wherein the barrier layer terminates over a top surface of the graphene layer and does not extend between the contact via and the second contact feature.

9. The interconnect structure of claim 8, wherein the graphene layer does not extend between the second dielectric layer and the barrier layer.

10. The interconnect structure of claim 8, wherein the barrier layer comprises cobalt-tungsten alloy, cobalt-manganese alloy, copper-aluminum alloy, nickel-aluminum alloy, or a combination thereof.

11. The interconnect structure of claim 8, wherein the barrier layer comprises titanium nitride, tantalum nitride, cobalt nitride, tungsten nitride, ruthenium nitride, or a combination thereof.

12. The interconnect structure of claim 8, wherein an interface between the graphene layer and the second contact feature is free of the barrier layer.

13. The interconnect structure of claim 8, further comprising a catalytic metal layer disposed between the graphene layer and the contact via.

14. The interconnect structure of claim 13, wherein the catalytic metal layer comprises nickel, cobalt, copper, ruthenium, platinum, or gold.

15. The interconnect structure of claim 13, wherein the catalytic metal layer is different from the second contact feature in terms of composition.

16. A contact structure, comprising:

a first contact feature in a first dielectric layer;

an etch stop layer over the first dielectric layer;

a graphene layer disposed over the first contact feature;

a catalytic metal layer disposed between the graphene layer and the first contact feature, a composition of the catalytic metal layer being different from a composition of the first contact feature;

a second dielectric layer over the etch stop layer;

a second contact feature over the graphene layer and disposed in the second dielectric layer; and a barrier layer between the second dielectric layer and the second contact feature.

17. The contact structure of claim 16, further comprising: wherein the catalytic metal layer is monocrystalline.

18. The contact structure of claim 17, wherein the catalytic metal layer comprises nickel, cobalt, copper, ruthenium, rhenium, rhodium, palladium, iridium, platinum, or gold.

19. The contact structure of claim 16, wherein the barrier layer terminates over a top surface of the graphene layer and does not extend over a top surface of the first contact feature.

20. The contact structure of claim 19, wherein the barrier layer comprises a cobalt-tungsten alloy (CoW), a cobalt-manganese alloy (CoMn), a copper-aluminum alloy (CuAl), a nickel-aluminum alloy (NiAl), tantalum nitride (TaN), titanium nitride (TiN), cobalt nitride (CoN), ruthenium nitride (RuN), or nickel nitride (NiN).

\* \* \* \* \*